(12) United States Patent
Kato et al.

(10) Patent No.: US 12,035,476 B2
(45) Date of Patent: Jul. 9, 2024

(54) DETECTION DEVICE

(71) Applicant: Japan Display Inc., Tokyo (JP)

(72) Inventors: Hirofumi Kato, Tokyo (JP); Yoshitaka Kojima, Tokyo (JP)

(73) Assignee: Japan Display Inc., Tokyo (JP)

(*) Notice: Subject to any disclaimer, the term of this patent is extended or adjusted under 35 U.S.C. 154(b) by 151 days.

(21) Appl. No.: 17/718,919

(22) Filed: Apr. 12, 2022

(65) Prior Publication Data

US 2022/0338352 A1    Oct. 20, 2022

(30) Foreign Application Priority Data

Apr. 14, 2021  (JP) .................................. 2021-068635

(51) Int. Cl.
*H05K 1/18* (2006.01)

(52) U.S. Cl.
CPC .............. *H05K 1/181* (2013.01); *H05K 1/189* (2013.01); *H05K 2201/10151* (2013.01)

(58) Field of Classification Search
CPC .................. H05K 1/181; H05K 1/189; H05K 2201/10151
See application file for complete search history.

(56) References Cited

U.S. PATENT DOCUMENTS

| | | | | |
|---|---|---|---|---|
| 2006/0001820 A1* | 1/2006 | Cheng | ................. | G02F 1/13452 349/150 |
| 2009/0027358 A1 | 1/2009 | Hosono | | |
| 2017/0069279 A1* | 3/2017 | Hayashi | ............... | G09G 3/3648 |
| 2018/0184523 A1* | 6/2018 | Yoo | ........................ | H05K 1/18 |
| 2019/0124769 A1* | 4/2019 | Miyashita | ............ | H05K 3/0097 |
| 2020/0027824 A1* | 1/2020 | Min | ...................... | H05K 1/0268 |
| 2020/0413539 A1 | 12/2020 | Iwai et al. | | |
| 2022/0240382 A1* | 7/2022 | Zhang | ................. | H05K 3/4007 |

FOREIGN PATENT DOCUMENTS

| | | |
|---|---|---|
| JP | 2009-032005 A | 2/2009 |
| JP | 2012-182409 A | 9/2012 |
| JP | 2012-227211 A | 11/2012 |
| JP | 2021-004968 A | 1/2021 |

OTHER PUBLICATIONS

Office Action issued in related Japanese Patent Application No. 2021-068635 mailed on May 7, 2024 and English translation of same. 6 pages.

* cited by examiner

*Primary Examiner* — Hoa C Nguyen

(74) *Attorney, Agent, or Firm* — K&L Gates LLP

(57) ABSTRACT

A detection device includes a sensor substrate provided with a plurality of photosensors, a control board provided with a control circuit configured to control the photosensors, and a flexible printed circuit board provided with wiring configured to electrically couple the sensor substrate to the control board. The flexible printed circuit board is provided with a plurality of cutting indication lines for changing a length between the sensor substrate and the flexible printed circuit board.

10 Claims, 29 Drawing Sheets

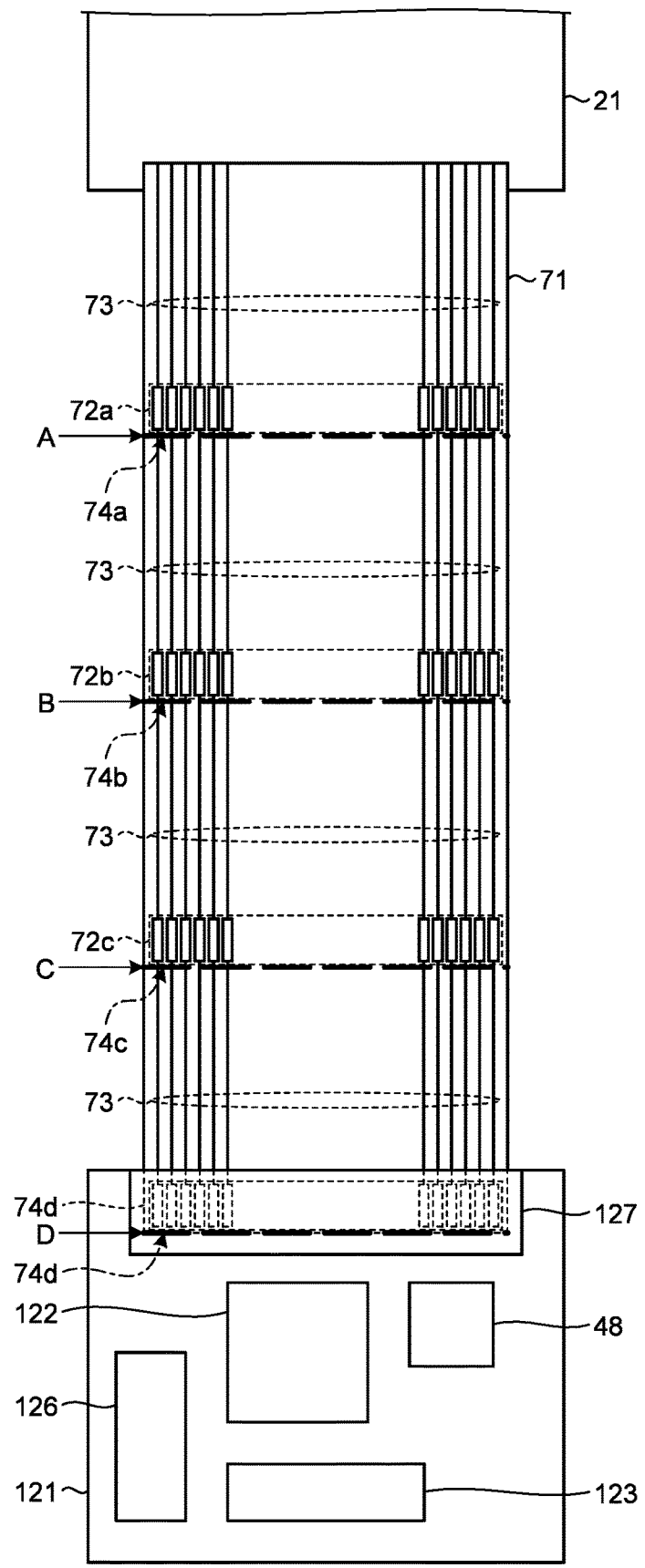

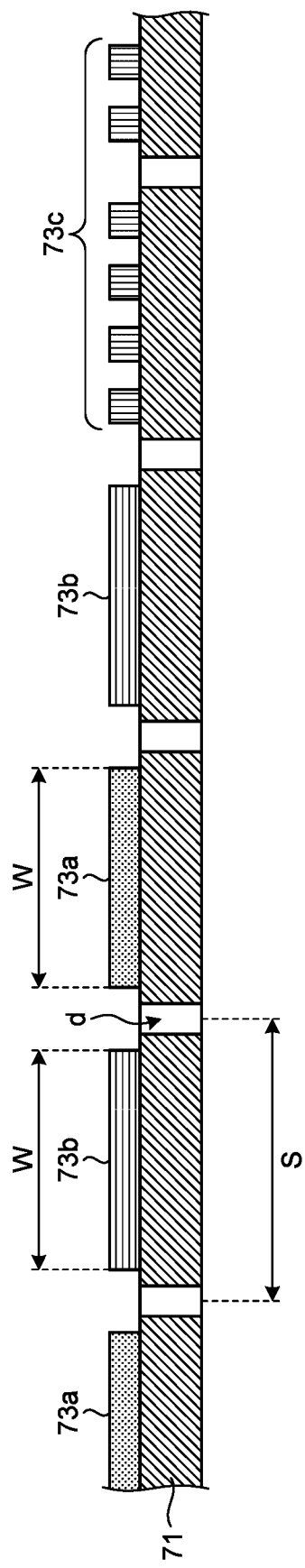

FIG.18

| DETERMINA-TION SIGNAL | CUTTING PART | | | |
|---|---|---|---|---|
| | A | B | C | D |
| LGout (A) | L | L | L | L |
| LGout (B) | H | L | L | L |
| LGout (C) | H | H | L | L |
| LGout (D) | H | H | H | L |

FIG.21

| DETERMINA-TION SIGNAL | CUTTING PART | | | |
|---|---|---|---|---|
| | A | B | C | D |
| LGout (A) | H | H | H | H |
| LGout (B) | L | H | H | H |
| LGout (C) | L | L | H | H |
| LGout (D) | L | L | L | H |

FIG.24

| DETERMINA-TION SIGNAL | CUTTING PART | | | |
|---|---|---|---|---|
| | A | B | C | D |
| LGout (A) | H | H | H | H |
| LGout (B) | H | H | H | L |
| LGout (C) | H | H | L | L |
| LGout (D) | H | L | L | L |

DETECTION DEVICE

CROSS-REFERENCE TO RELATED APPLICATION

This application claims the benefit of priority from Japanese Patent Application No. 2021-068635 filed on Apr. 14, 2021, the entire contents of which are incorporated herein by reference.

BACKGROUND

1. Technical Field

The present invention relates to a detection device.

2. Description of the Related Art

Photosensors capable of detecting fingerprint patterns and vascular patterns of, for example, veins are known (for example, Japanese Patent Application Laid-open Publication No. 2009-032005).

The photosensors are required to detect various types of biological information on an object to be detected, such as a pulse wave and a blood oxygen saturation level obtained from the pulse wave, in addition to the vascular patterns of, for example, veins mentioned above. The photosensors are also required to have an optimal configuration according to the biological information and a situation of the object to be detected serving as a detection target. For example, a configuration is conceivable in which the photosensors are coupled to a controller that controls the photosensors by, for example, a flexible printed circuit (FPC) board. In such a configuration, for example, when the biological information is acquired by imaging a finger of the object to be detected or when the biological information is acquired by imaging a wrist of the object to be detected, the FPC needs to be prepared according to various use conditions and application portions when acquiring the biological information, such as a difference in physique of a subject from which the biological information is acquired, or whether the biological information is acquired in a clinical setting or when the subject is exercising.

It is an object of the present invention to provide a detection device adaptable to various use conditions and application portions.

SUMMARY

A detection device according to an embodiment of the present disclosure includes a sensor substrate provided with a plurality of photosensors, a control board provided with a control circuit configured to control the photosensors, and a flexible printed circuit board provided with wiring configured to electrically couple the sensor substrate to the control board. The flexible printed circuit board is provided with a plurality of cutting indication lines for changing a length between the sensor substrate and the flexible printed circuit board.

BRIEF DESCRIPTION OF THE DRAWINGS

FIG. 12D is a diagram illustrating a fourth coupling example between the FPC and the control board;

FIG. 14 illustrates sectional views along the cutting indication lines;

FIG. 18 is a chart illustrating relations between each determination signal and cutting parts in the cutting part determination circuit according to Modification 1;

FIG. 21 is a chart illustrating the relations between each of the determination signals and the cutting parts in the cutting part determination circuit according to Modification 2;

FIG. 24 is a chart illustrating the relations between each of the determination signals and the cutting parts in a cutting part determination circuit according to Modification 3.

DETAILED DESCRIPTION

Figure 1:
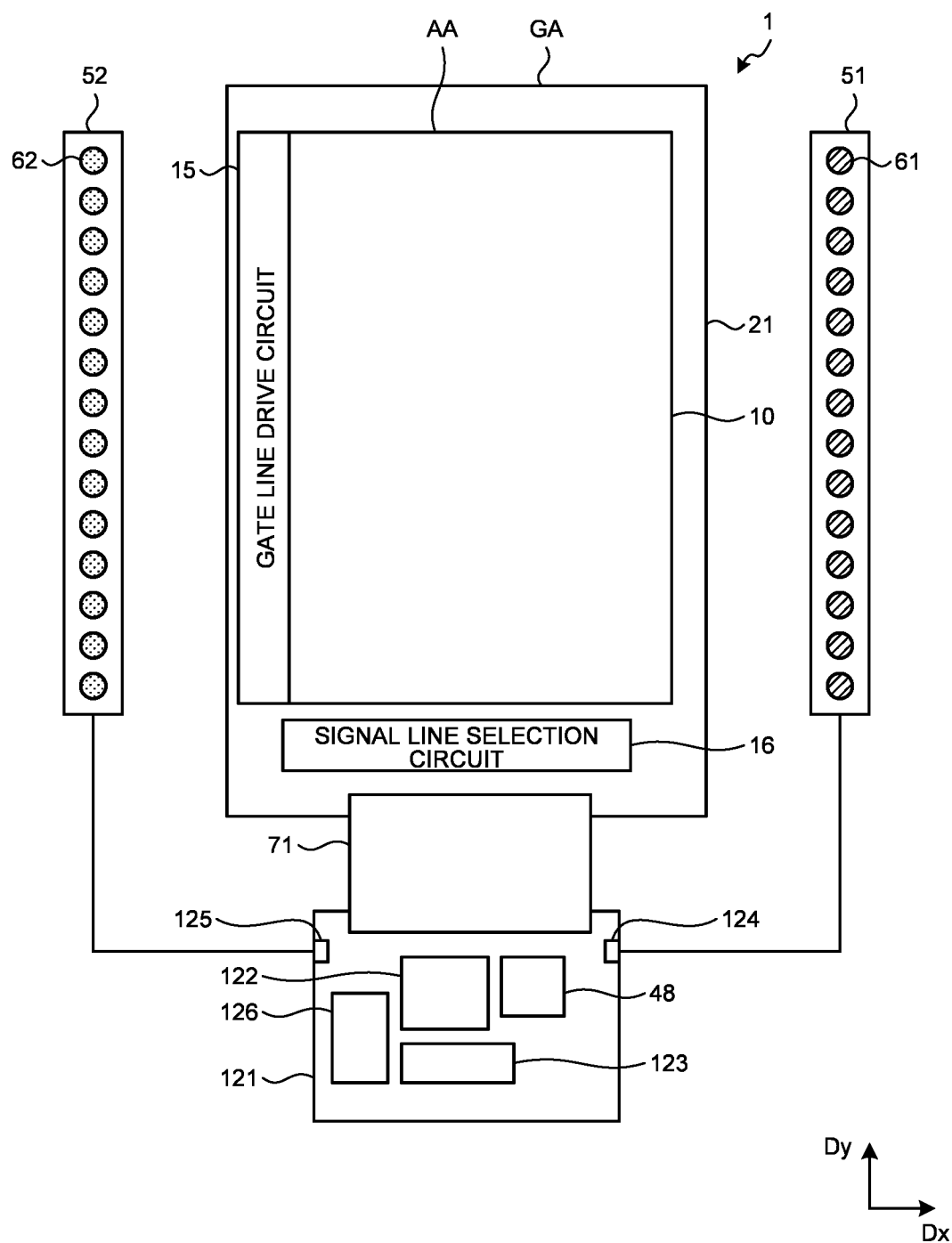
FIG. 1 is a plan view illustrating a detection device according to an embodiment of the present invention.

The following describes a mode (embodiment) for carrying out the present invention in detail with reference to the drawings. The present invention is not limited to the description of the embodiment to be given below. Components to be described below include those easily conceivable by those skilled in the art or those substantially identical thereto. In addition, the components to be described below can be combined as appropriate. What is disclosed herein is merely an example, and the present invention naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present invention is not limited thereto. The same component as that described with reference to an already mentioned drawing is denoted by the same reference numeral through the description and the drawings, and detailed description thereof may not be repeated where appropriate.

FIG. 1 is a plan view illustrating a detection device according to the embodiment. As illustrated in FIG. 1, a detection device 1 includes a sensor substrate 21, a sensor area 10, a gate line drive circuit 15, a signal line selection circuit 16, a detection circuit 48, a control circuit 122, a power supply circuit 123, and first and second light sources 61 and 62. FIG. 1 illustrates an example in which the first light sources 61 are provided on a first light source base material 51 and the second light sources 62 are provided on a second light source base material 52. However, the arrangement of the first and the second light sources 61 and 62 illustrated in FIG. 1 is merely an example, and can be changed as appropriate. For example, the first light sources 61 and the second light sources 62 may be arranged on each of the first light source base material 51 and the second light source base material 52. In this case, a group including the first light sources 61 and a group including the second light sources 62 may be arranged side by side in the second direction Dy, or the first light sources 61 and the second light sources 62 may be alternately arranged in the second direction Dy. The first and the second light sources 61 and 62 may be provided on one light source base material, or three or more light source base materials. Furthermore, the first and the second light sources 61 and 62 may be light sources of the same type. Alternatively, the first and the second light sources 61 and 62 may be, for example, what is called direct-type light sources provided directly below a detection area AA.

A control board 121 is electrically coupled to the sensor substrate 21 through a flexible printed circuit board 71 (hereinafter, also called "FPC 71"). The control board 121 is provided with the detection circuit 48, the control circuit 122, the power supply circuit 123, and an output circuit 126. In an aspect of the present invention, the FPC 71 may be provided with the detection circuit 48.

In the present disclosure, the length of the FPC 71 can be changed according to use conditions and applications of the detection device 1. A configuration for changing the length of the FPC 71 will be described later.

The control circuit 122 includes, for example, a control integrated circuit (IC) that outputs logic control signals. In an aspect of the present invention, the control circuit 122 may include, for example, a programmable logic device (PLD) such as a field-programmable gate array (FPGA).

The control circuit 122 supplies control signals to the sensor area 10, the gate line drive circuit 15, and the signal line selection circuit 16 to control a detection operation of the sensor area 10. The control circuit 122 also supplies control signals to the first and the second light sources 61 and 62 to control lighting or non-lighting of the first and the second light sources 61 and 62.

The power supply circuit 123 supplies voltage signals including, for example, a sensor power supply potential VDDSNS (refer to FIG. 4) to the sensor area 10, the gate line drive circuit 15, and the signal line selection circuit 16. The power supply circuit 123 supplies a power supply voltage to the first and the second light sources 61 and 62.

The output circuit 126 is, for example, a Universal Serial Bus (USB) controller IC, and controls communication between the control circuit 122 and an external higher-level control device (not illustrated).

The sensor substrate 21 has the detection area AA and a peripheral area GA. The detection area AA is an area provided with a plurality of photosensors PD (refer to FIG. 4) included in the sensor area 10. The peripheral area GA is an area between the outer perimeter of the detection area AA and the ends of the sensor substrate 21, and is an area not provided with the photosensors PD.

The gate line drive circuit 15 and the signal line selection circuit 16 are provided in the peripheral area GA. Specifically, the gate line drive circuit 15 is provided in an area extending along the second direction Dy in the peripheral area GA. The signal line selection circuit 16 is provided in an area extending along a first direction Dx in the peripheral area GA, and is provided between the sensor area 10 and the detection circuit 48.

The first direction Dx is one direction in a plane parallel to the sensor substrate 21. The second direction Dy is one direction in the plane parallel to the sensor substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the sensor substrate 21.

The first light sources 61 are provided on the first light source base material 51, and are arranged along the second direction Dy. The second light sources 62 are provided on the second light source base material 52, and are arranged along the second direction Dy. The first light source base material 51 and the second light source base material 52 are electrically coupled, through terminals 124 and 125, respectively, to the control circuit 122 and the power supply circuit 123 provided on the control board 121.

For example, inorganic light-emitting diodes (LEDs) or organic electroluminescence (organic light-emitting diodes: OLEDs) are used as the first and the second light sources 61 and 62. The first and the second light sources 61 and 62 emit first light and second light, respectively, having different wavelengths. Alternatively, in an aspect of the present invention, the first and the second light sources 61 and 62 may emit light having the same wavelength.

The first light emitted from the first light sources 61 is, for example, mainly reflected on a surface of an object to be detected, such as a finger Fg, and enters the sensor area 10. As a result, the sensor area 10 can detect a fingerprint by detecting a shape of asperities on the surface of the finger Fg or the like. The second light emitted from the second light sources 62 is, for example, reflected in the object to be detected, such as the finger Fg or a wrist, or transmitted through the finger Fg, the wrist, or the like, and enters the sensor area 10. As a result, the sensor area 10 can detect information on a living body in the finger Fg, the wrist, or the like. Examples of the information on the living body include a pulse wave, pulsation, and a blood vessel image of the finger Fg, the wrist, or a palm. That is, the detection device 1 is configured as a detection device that detects the information on the living body including the fingerprint, the pulse wave, the pulsation, and vascular patterns of, for example, veins.

The first light may have a wavelength of from 520 nm to 600 nm, for example, a wavelength of approximately 500 nm, and the second light may have a wavelength of from 780 nm and 950 nm, for example, a wavelength of approximately 850 nm. In this case, the first light is visible light in blue or green (blue light or green light), and the second light is infrared light. The sensor area 10 can detect the fingerprint based on the first light emitted from the first light sources 61. The second light emitted from the second light sources 62 is reflected in the object to be detected such as the finger Fg, or transmitted through or absorbed by the finger Fg or the like, and enters the sensor area 10. As a result, the sensor area 10 can detect the pulse wave or the blood vessel image (vascular patterns) of the veins and the like as the information on the living body in the finger Fg or the like.

Alternatively, the first light may have a wavelength of from 600 nm to 700 nm, for example, approximately 660 nm, and the second light may have a wavelength of from 780 nm and 950 nm, for example, approximately 850 nm. In this case, the first light is visible light in red (red light), and the second light is infrared light. Based on the first light emitted from the first light sources 61 and the second light emitted from the second light sources 62, the sensor area 10 can detect a blood oxygen level, in addition to the pulse wave, the pulsation, and the blood vessel image, as the information on the living body. As described above, the detection device 1 includes the first and the second light sources 61 and 62, and performs the detection based on the first light and the detection based on the second light, and thereby can detect the various types of information on the living body.

Figure 2:
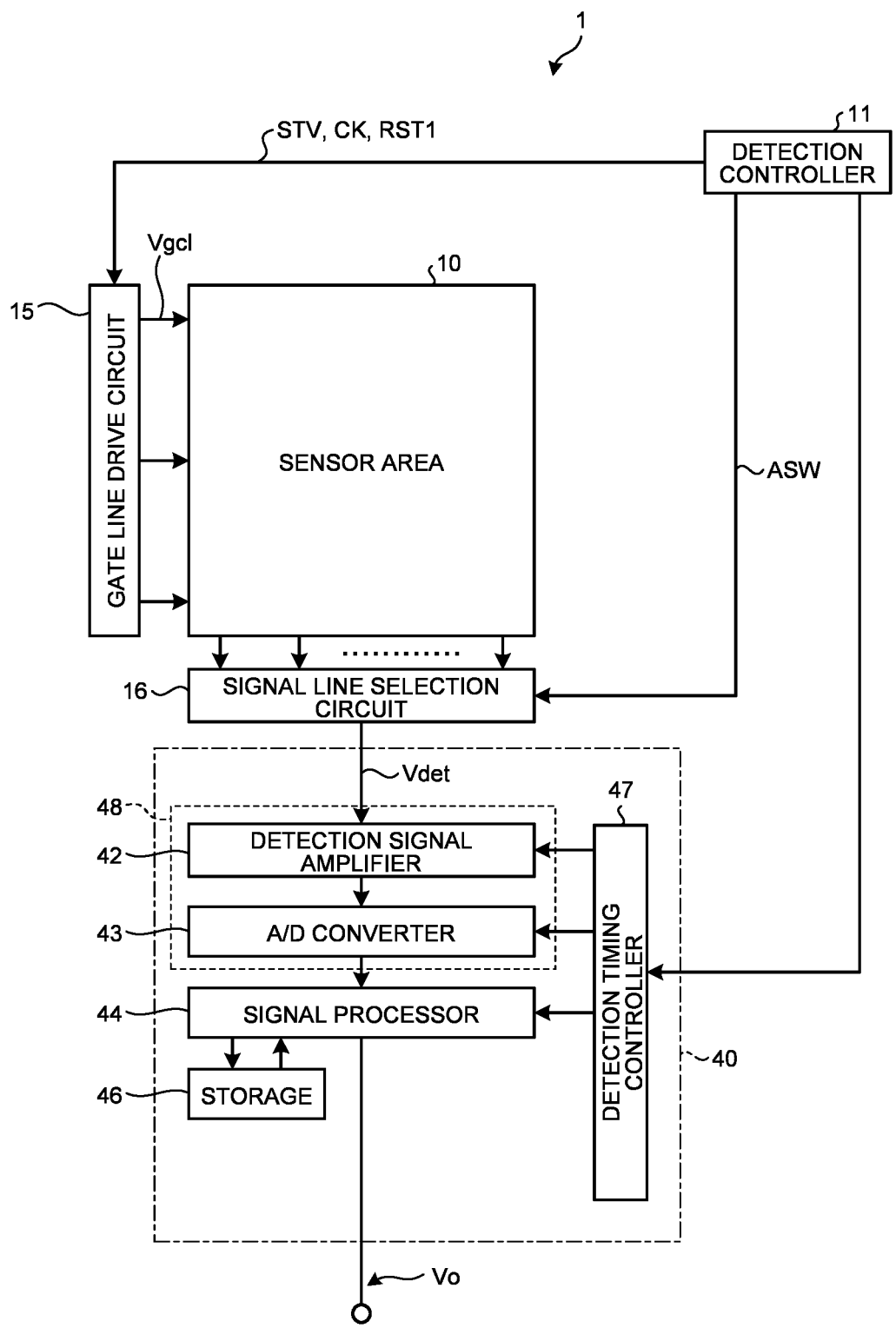
FIG. 2 is a block diagram illustrating a configuration example of the detection device according to the embodiment.

FIG. 2 is a block diagram illustrating a configuration example of the detection device according to the embodiment. As illustrated in FIG. 2, the detection device 1 further includes a detection controller (detection control circuit) 11 and a detector 40.

The sensor area 10 includes the photosensors PD. Each of the photosensors PD included in the sensor area 10 is a photodiode, and outputs an electrical signal corresponding to light emitted thereto as a detection signal Vdet to the signal line selection circuit 16. The sensor area 10 performs the detection in response to a gate drive signal Vgcl supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals including, for example, a start signal STV, a clock signal CK, and a reset signal RST1 to the gate line drive circuit 15. The detection controller 11 also supplies various control signals including, for example, a selection signal ASW to the signal line selection circuit 16. The detection controller 11 supplies various control signals to the first and the second light sources 61 and 62 to control the lighting and the non-lighting of each of these groups of light sources.

The gate line drive circuit 15 is a circuit that drives a plurality of gate lines GCL (refer to FIG. 3) based on the various control signals. The gate line drive circuit 15 sequentially or simultaneously selects the gate lines GCL, and supplies the gate drive signals Vgcl to the selected gate lines GCL. Through this operation, the gate line drive circuit 15 selects the photosensors PD coupled to the gate lines GCL.

Figure 3:
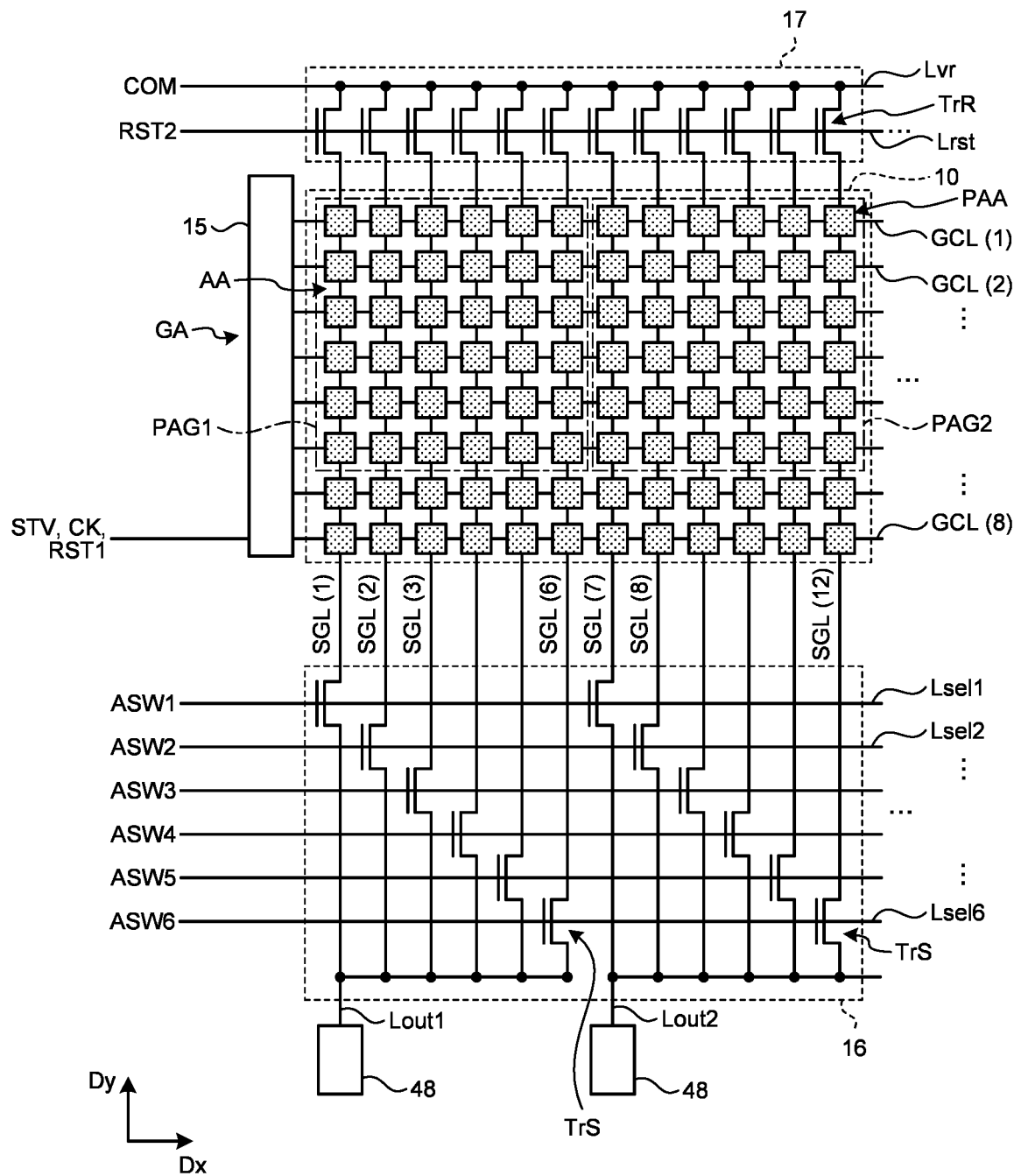
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 electrically couples the selected signal lines SGL to the detection circuit 48 based on the selection signal ASW supplied from the detection controller 11. Through this operation, the signal line selection circuit 16 outputs the first detection signal Vdet of each of the photosensors PD to the detector 40.

The detector 40 includes the detection circuit 48, a signal processor (signal processing circuit) 44, a storage 46, and a detection timing controller (detection timing control circuit) 47. Based on a control signal supplied from the detection controller 11, the detection timing controller 47 controls the detection circuit 48 and the signal processor 44 so as to operate in synchronization with each other.

The detection circuit 48 is, for example, an analog front-end (AFE) circuit. The detection circuit 48 is a signal processing circuit having functions of at least a detection signal amplifier 42 and an analog-to-digital (A/D) converter 43. The detection signal amplifier 42 amplifies the detection signals Vdet. The A/D converter 43 converts analog signals output from the detection signal amplifier 42 into digital signals.

In the present disclosure, the signal processor 44 is included in the control circuit 122. The signal processor 44 is a logic circuit that processes the signals detected by the sensor area 10 based on signals output from the detection circuit 48.

In the present disclosure, the storage 46 is included in the control circuit 122. The storage 46 temporarily stores therein the signals processed by the signal processor 44. The storage 46 may be, for example, a random-access memory (RAM) or a register circuit.

The following describes a circuit configuration example of the detection device 1. FIG. 3 is a circuit diagram illustrating the detection device. As illustrated in FIG. 3, the sensor area 10 has a plurality of partial detection areas PAA arranged in a matrix having a row-column configuration. Each of the partial detection areas PAA is provided with the photosensor PD.

The gate lines GCL extend in the first direction Dx, and are coupled to the partial detection areas PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when need not be distinguished from one another. For ease of understanding of the description, FIG. 3 illustrates eight of the gate lines GCL. However, this is merely an example, and M (where M is eight or larger, and is, for example, 256) of the gate lines GCL may be arranged.

The signal lines SGL extend in the second direction Dy, and are coupled to the photosensors PD of the partial detection areas PAA arranged in the second direction Dy. A plurality of signal lines SGL(1), SGL(2), ..., SGL(12) are arranged in the first direction Dx, and are each coupled to the signal line selection circuit 16 and a reset circuit 17. In the following description, the signal lines SGL(1), SGL(2), ..., SGL(12) will each be simply referred to as the signal line SGL when need not be distinguished from one another.

For ease of understanding of the description, 12 of the signal lines SGL are illustrated. However, this is merely an example, and N (where N is 12 or larger, and is, for example, 252) of the signal lines SGL may be arranged. In FIG. 3, the sensor area 10 is provided between the signal line selection circuit 16 and the reset circuit 17. The present invention is not limited thereto. The signal line selection circuit 16 and the reset circuit 17 may be coupled to ends of the signal lines SGL in the same direction.

The gate line drive circuit 15 receives the various control signals such as the start signal STV, the clock signal CK, and the reset signal RST1 from the control circuit 122 (refer to FIG. 1). The gate line drive circuit 15 sequentially selects the gate lines GCL(1), GCL(2), ..., GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding ones of the partial detection areas PAA arranged in the first direction Dx are selected as detection targets.

The gate line drive circuit 15 may perform different driving for each of detection modes including the detection of the fingerprint and the detection of a plurality of different items of information on the living body (including, for example, the pulse wave, the pulsation, the blood vessel image of the veins and the like, and the blood oxygen level, and hereinafter, also simply called "biological information"). For example, the gate line drive circuit 15 may drive the gate lines GCL in a bundle.

Specifically, the gate line drive circuit 15 simultaneously selects a predetermined number of the gate lines GCL from among the gate lines GCL(1), GCL(2), ..., GCL(8) based on the control signals. For example, the gate line drive circuit 15 simultaneously selects six of the gate lines GCL (1) to GCL(6), and supplies thereto the gate drive signals Vgcl. The gate line drive circuit 15 supplies the gate drive signals Vgcl through the selected six gate lines GCL to the first switching elements Tr. Through this operation, block units PAG1 and PAG2 each including corresponding ones of the partial detection areas PAA arranged in the first direction Dx and the second direction Dy are selected as the respective detection targets. The gate line drive circuit 15 drives the predetermined number of the gate lines GCL in a bundle, and sequentially supplies the gate drive signals Vgcl to each unit of the predetermined number of the gate lines GCL.

The signal line selection circuit 16 includes a plurality of selection signal lines Lsel, a plurality of output signal lines Lout, and third switching elements TrS. The third switching elements TrS are provided correspondingly to the respective signal lines SGL. Six of the signal lines SGL(1), SGL(2), ..., SGL(6) are coupled to a common output signal line Lout1. Six of the signal lines SGL(7), SGL(8), ..., SGL(12) are coupled to a common output signal line Lout2. The output signal lines Lout1 and Lout2 are each coupled to the detection circuit 48.

The signal lines SGL(1), SGL(2), ..., SGL(6) are grouped into a first signal line block, and the signal lines SGL(7), SGL(8), ..., SGL(12) are grouped into a second signal line block. The selection signal lines Lsel are coupled to the gates of the respective third switching elements TrS included in each of the signal line blocks. Each of the selection signal lines Lsel is coupled to the gates of corresponding ones of the third switching elements TrS in the signal line blocks.

Specifically, selection signal lines Lsel1, Lsel2, ..., Lsel6 are coupled to the third switching elements TrS corresponding to the signal lines SGL(1), SGL(2), ..., SGL(6), respectively. The selection signal line Lsel1 is coupled to one of the third switching elements TrS corresponding to the signal line SGL(1) and one of the third switching elements TrS corresponding to the signal line SGL(7). The selection signal line Lsel2 is coupled to one of the third switching elements TrS corresponding to the signal line SGL(2) and one of the third switching elements TrS corresponding to the signal line SGL(8).

The control circuit 122 (refer to FIG. 1) sequentially supplies the selection signal ASW to the selection signal lines Lsel. Through the operations of the third switching elements TrS, the signal line selection circuit 16 sequentially selects the signal lines SGL in one of the signal line blocks in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs.

The signal lines SGL of the signal line selection circuit 16 may be bundled and coupled to the detection circuit 48. Specifically, the control circuit 122 (refer to FIG. 1) simultaneously supplies the selection signal ASW to the selection signal lines Lsel. The signal line selection circuit 16 operates the third switching elements TrS to select the signal lines SGL (for example, six of the signal lines SGL) in one of the signal line blocks, and couples the signal lines SGL to the detection circuit 48. As a result, the signals detected in each of the block units PAG1 and PAG2 are output to the detection circuit 48. In this case, the signals from the partial detection areas PAA (photosensors PD) included in each of the block units PAG1 and PAG2 are put together and output to the detection circuit 48.

Through the operations of the gate line drive circuit 15 and the signal line selection circuit 16, the detection is performed for each of the block units PAG1 and PAG2. As a result, the intensity of the first detection signal Vdet obtained by a single detection operation increases, so that the sensor sensitivity can be improved.

As illustrated in FIG. 3, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 4) included in each of the partial detection areas PAA.

Figure 4:
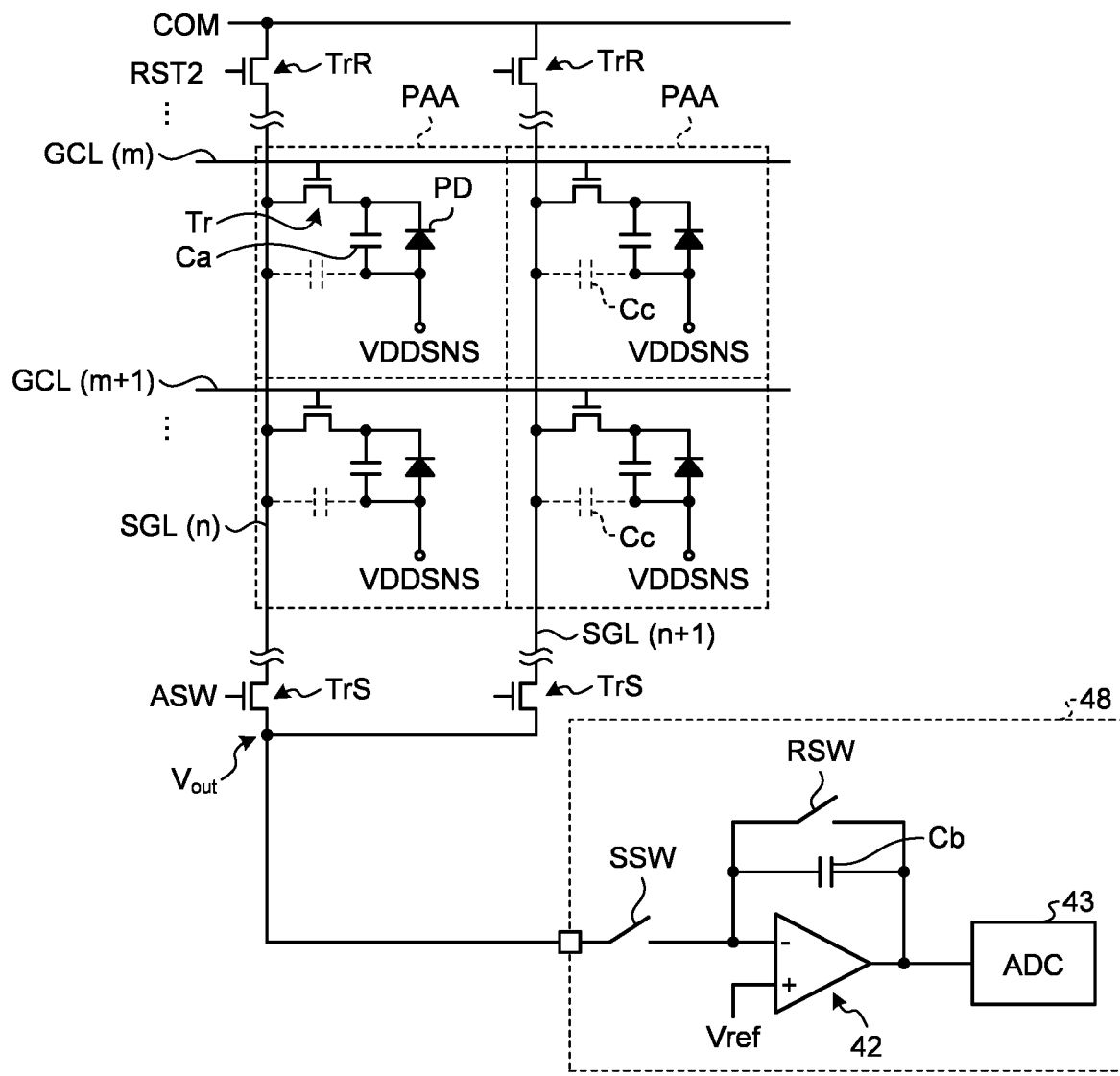
FIG. 4 is a circuit diagram illustrating a plurality of partial detection areas.

FIG. 4 is a circuit diagram illustrating the partial detection areas of the detection device according to the embodiment. FIG. 4 also illustrates a circuit configuration of the detection circuit 48. As illustrated in FIG. 4, each of the partial detection areas PAA includes the photosensor PD, the capacitive element Ca, a first switching element Tr1, and a fourth switching element Tr4. The capacitive element Ca is capacitance (sensor capacitance) generated in the photosensor PD, and is equivalently coupled in parallel with the photosensor PD. In addition, signal line capacitance Cc is parasitic capacitance generated in the signal line SGL, and is equivalently generated between the signal line SGL and a node between the anode of the photosensor PD and one end side of the capacitive element Ca.

FIG. 4 illustrates two gate lines GCL(m) and GCL(m+1) arranged in the second direction Dy among the gate lines GCL. FIG. 4 also illustrates two signal lines SGL(n) and SGL(n+1) arranged in the first direction Dx among the signal lines SGL. The partial detection area PAA is an area surrounded by the gate lines GCL and the signal lines SGL.

Each of the first switching elements Tr is provided correspondingly to the photosensor PD. The first switching element Tr is constituted by a thin-film transistor, and in this example, constituted by an n-channel metal oxide semiconductor (MOS) thin-film transistor (TFT).

The gates of the first switching elements Tr belonging to the partial detection areas PAA arranged in the first direction Dx are coupled to the gate line GCL. The sources of the first switching elements Tr belonging to the partial detection areas PAA arranged in the second direction Dy are coupled to the signal line SGL. The drain of the first switching element Tr is coupled to the cathode of the photosensor PD and the capacitive element Ca.

The anode of the photosensor PD is supplied with the sensor power supply signal VDDSNS from the power supply circuit 123. The signal line SGL and the capacitive element Ca are supplied with the reference signal COM that serves as an initial potential of the signal line SGL and the capacitive element Ca from the power supply circuit 123.

When the partial detection area PAA is irradiated with light, a current corresponding to the amount of the light flows through the photosensor PD. As a result, an electrical charge is stored in the capacitive element Ca. After the first switching element Tr is turned on, a current corresponding to the electrical charge stored in the capacitive element Ca flows through the signal line SGL. The signal line SGL is coupled to the detection circuit 48 through a corresponding one of the third switching elements TrS of the signal line selection circuit 16. Thus, the detection device 1 can detect a signal corresponding to the amount of the light irradiating the photosensor PD in each of the partial detection areas PAA or signals corresponding to the amounts of the light irradiating the photosensors PD in each of the block units PAG1 and PAG2.

During a reading period Pdet (refer to FIG. 6), a switch SSW of the detection circuit 48 is turned on, and the detection circuit 48 is coupled to the signal lines SGL. The detection signal amplifier 42 of the detection circuit 48 converts a variation of a current supplied from the signal lines SGL into a variation of a voltage, and amplifies the result. A reference potential (Vref) having a fixed potential is supplied to a non-inverting input portion (+) of the detection signal amplifier 42, and the signal lines SGL are coupled to an inverting input terminal (−) of the detection signal amplifier 42. In the present embodiment, the same signal as the reference signal COM is supplied as the reference potential (Vref) voltage. The detection signal amplifier 42 includes a capacitive element Cb and a reset switch RSW. During a reset period Prst (refer to FIG. 6), the reset switch RSW is turned on, and an electrical charge of the capacitive element Cb is reset.

Figure 5A:
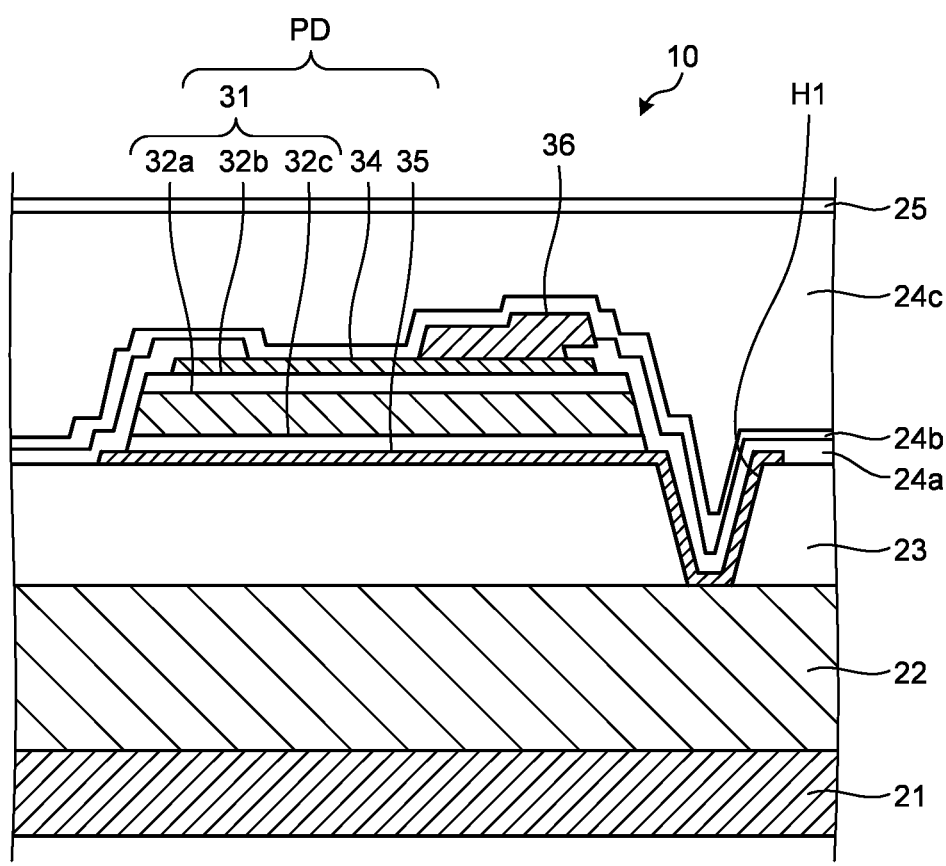
FIG. 5A is a sectional view illustrating a schematic sectional configuration of a sensor area.

The following describes a configuration of the photosensor PD. FIG. 5A is a sectional view illustrating a schematic sectional configuration of the sensor area. As illustrated in FIG. 5A, the sensor area 10 includes the sensor substrate 21, a TFT layer 22, an insulating layer 23, the photosensor PD, and insulating layers 24a, 24b, 24c, and 25.

The sensor substrate 21 is an insulating base material, and is made using, for example, glass or a resin material. The sensor substrate 21 is not limited to having a flat plate shape, and may have a curved surface. In this case, the sensor substrate 21 may be made of a film-like resin.

The sensor substrate 21 has a first surface and a second surface on the opposite side of the first surface. The TFT layer 22, the insulating layer 23, the photosensor PD, the insulating layers 24 and 25 are stacked in this order on the first surface, The TFT layer 22 is provided with circuits such as the gate line drive circuit 15 and the signal line selection circuit 16 described above. The TFT layer 22 is also provided with thin-film transistors (TFTs) such as the first switching elements Tr and various types of wiring such as the gate lines GCL and the signal lines SGL. The sensor substrate 21 and the TFT layer 22 form a drive circuit board for driving the sensor for each predetermined detection area, which is also called a backplane or an array substrate.

The insulating layer 23 is an organic insulating layer, and is provided above the TFT layer 22. The insulating layer 23 is a planarizing layer that planarizes asperities formed by the first switching element Tr formed in the TFT layer 22 and various conductive layers.

The photosensor PD is provided above the insulating layer 23. The photosensor PD includes a lower electrode 35, a semiconductor layer 31, and an upper electrode 34, which are stacked in this order.

The lower electrode 35 is provided above the insulating layer 23, and is electrically coupled to the first switching element Tr in the TFT layer 22 through a contact hole Hl. The lower electrode 35 is the cathode of the photosensor PD, and is an electrode for reading the detection signal Vdet. A metal material such as molybdenum (Mo) or aluminum (Al) is used as the lower electrode 35. Alternatively, the lower electrode 35 may be a multilayered film formed by stacking these metal materials. The lower electrode 35 may be formed of, for example, a light-transmitting conductive material such as indium tin oxide (ITO).

The semiconductor layer 31 is formed of, for example, amorphous silicon (a-Si). The semiconductor layer 31 includes an i-type semiconductor layer 32a, a p-type semiconductor layer 32b, and an n-type semiconductor layer 32c. The i-type semiconductor layer 32a, the p-type semiconductor layer 32b, and the n-type semiconductor layer 32c are specific examples of photoelectric conversion elements. In FIG. 5A, the n-type semiconductor layer 32c, the i-type semiconductor layer 32a, and the p-type semiconductor layer 32b are stacked in this order in a direction orthogonal to a surface of the sensor substrate 21. However, the semiconductor layer 31 may have a reversed configuration, that is, the p-type semiconductor layer 32b, the i-type semiconductor layer 32a, and the n-type semiconductor layer 32c may be stacked in this order. The semiconductor layer 31 may be a photoelectric conversion element formed of organic semiconductors.

The a-Si of the n-type semiconductor layer 32c is doped with impurities to form an n+ region. The a-Si of the p-type semiconductor layer 32b is doped with impurities to form a p+ region. The i-type semiconductor layer 32a is, for example, a non-doped intrinsic semiconductor, and has lower conductivity than that of the p-type semiconductor layer 32b and the n-type semiconductor layer 32c.

The upper electrode 34 is the anode of the photosensor PD, and is an electrode for supplying the sensor power supply signal VDDSNS to a photoelectric conversion layer. The upper electrode 34 is a light-transmitting conductive layer of, for example, ITO, and a plurality of the upper electrodes 34 are provided for each of the photosensors PD.

The insulating layer 24a and 24b are provided above the insulating layer 23. The insulating layer 24a covers the periphery of the upper electrode 34, and is provided with an opening in a position overlapping the upper electrode 34. Coupling wiring 36 is coupled to the upper electrode 34 at a portion of the upper electrode 34 not provided with the insulating layer 24a. The insulating layer 24b is provided above the insulating layer 24a so as to cover the upper electrode 34 and the coupling wiring 36. The insulating layer 24c serving as a planarizing layer is provided above the insulating layer 24b. The insulating layer 25 is provided above the insulating layer 24c. However, the insulating layer 25 need not be provided.

Figure 5B:
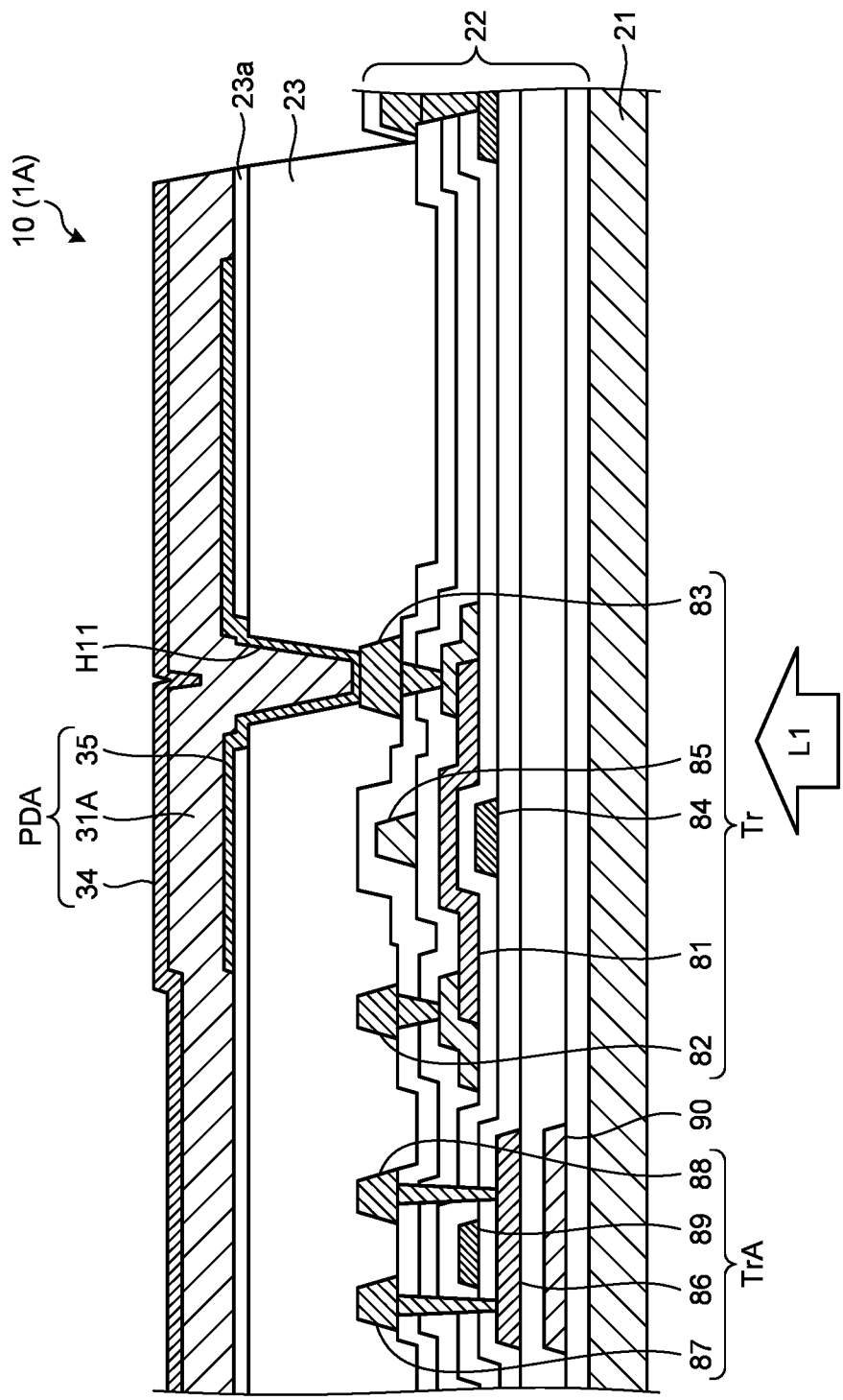
FIG. 5B is a sectional view illustrating a schematic sectional configuration of the sensor area of a detection device according to a first modification.

FIG. 5B is a sectional view illustrating a schematic sectional configuration of the sensor area of a detection device according to a first modification. As illustrated in FIG. 5B, in a detection device 1A of the first modification, a photosensor PDA is provided above an insulating layer 23a. The insulating layer 23a is an inorganic insulating layer provided so as to cover the insulating layer 23, and is formed of, for example, silicon nitride (SiN). The photosensor PDA includes a photoelectric conversion layer 31A, the lower electrode 35 (cathode electrode), and the upper electrode 34 (anode electrode). The lower electrode 35, the photoelectric conversion layer 31A, and the upper electrode 34 are stacked in this order in a direction orthogonal to a first surface S1 of the sensor substrate 21.

The photoelectric conversion layer 31A changes in characteristics (for example, voltage-current characteristics and a resistance value) according to light emitted thereto. An organic material is used as a material of the photoelectric conversion layer 31A. Specifically, as the photoelectric conversion layer 31A, low-molecular-weight organic materials can be used including, for example, fullerene (C60), phenyl C61-butyric acid methyl ester (PCBM), copper phthalocyanine (CuPc), fluorinated copper phthalocyanine (F16CuPc), rubrene (5,6,11,12-tetraphenyltetracene), and PDI (a derivative of perylene).

The photoelectric conversion layer 31A can be formed by a vapor deposition process (dry process) using the above-listed low-molecular-weight organic materials. In this case, the photoelectric conversion layer 31A may be, for example, a multilayered film of CuPc and F16CuPc, or a multilayered film of rubrene and C60. The photoelectric conversion layer 31A can also be formed by a coating process (wet process). In this case, the photoelectric conversion layer 31A is made using a material obtained by combining the above-listed low-molecular-weight organic materials with high-molecular-weight organic materials. For example, poly(3-hexylthiophene) (P3HT) and F8-alt-benzothiadiazole (F8BT) can be used as the high-molecular-weight organic materials. The photoelectric conversion layer 31A can be a film in the state of a mixture of P3HT and PCBM or a film in the state of a mixture of F8BT and PDI.

The lower electrode 35 faces the upper electrode 34 with the photoelectric conversion layer 31A interposed therebetween. The upper electrode 34 is formed of, for example, a light-transmitting conductive material such as ITO. For example, a metal material such as silver (Ag) or aluminum (Al) are used as the lower electrode 35. Alternatively, the lower electrode 35 may be made of an alloy material containing at least one or more of these metal materials.

The lower electrode 35 can be formed as a light-transmitting transflective electrode by controlling the film thickness of the lower electrode 35. For example, the lower electrode 35 formed of a thin Ag film having a thickness of 10 nm has light transmittance of approximately 60%. In this case, the photosensor PDA can detect light emitted from both sides of the sensor substrate 21, for example, both light L1 emitted from the first surface S1 side and light emitted from a second surface S2 side.

Although not illustrated in FIG. 5B, the insulating layer 24 may be provided so as to cover the upper electrode 34. The insulating layer is a passivation film, and is provided to protect the photosensor PDA.

As illustrated in FIG. 5B, the TFT layer 22 is provided with the first switching element Tr electrically coupled to the photosensor PDA. The first switching element Tr includes a semiconductor layer 81, a source electrode 82, a drain electrode 83, and gate electrodes 84 and 85. The lower electrode 35 of the photosensor PDA is electrically coupled to the drain electrode 83 of the first switching element Tr through a contact hole H11 provided in the insulating layers 23 and 23a.

The first switching element Tr has what is called a dual-gate structure having the gate electrodes 84 and 85 on both the upper and lower sides of the semiconductor layer 81. However, the first switching element Tr is not limited to this structure, and may have a top-gate structure or a bottom-gate structure.

FIG. 5B schematically illustrates a second switching element TrA and a terminal provided in the peripheral area GA. The second switching element TrA is, for example, a switching element provided in the gate line drive circuit 15 (refer to FIG. 1). The second switching element TrA includes a semiconductor layer 86, a source electrode 87, a drain electrode 88, and a gate electrode 89. The second switching element TrA has what is called a top-gate structure in which the gate electrode 89 is provided above the semiconductor layer 86. A light-blocking film 90 is provided between the semiconductor layer 86 and the sensor substrate 21 below the semiconductor layer 86. The second switching element TrA is, however, not limited to the above-described structure, and may have a bottom-gate structure or a dual-gate structure.

The semiconductor layer 81 of the first switching element Tr is provided in a layer different from that of the semiconductor layer 86 of the second switching element TrA. The semiconductor layer 81 of the first switching element Tr is formed of, for example, an oxide semiconductor. The semiconductor layer 86 of the second switching element TrA is formed of, for example, polysilicon.

Figure 6:
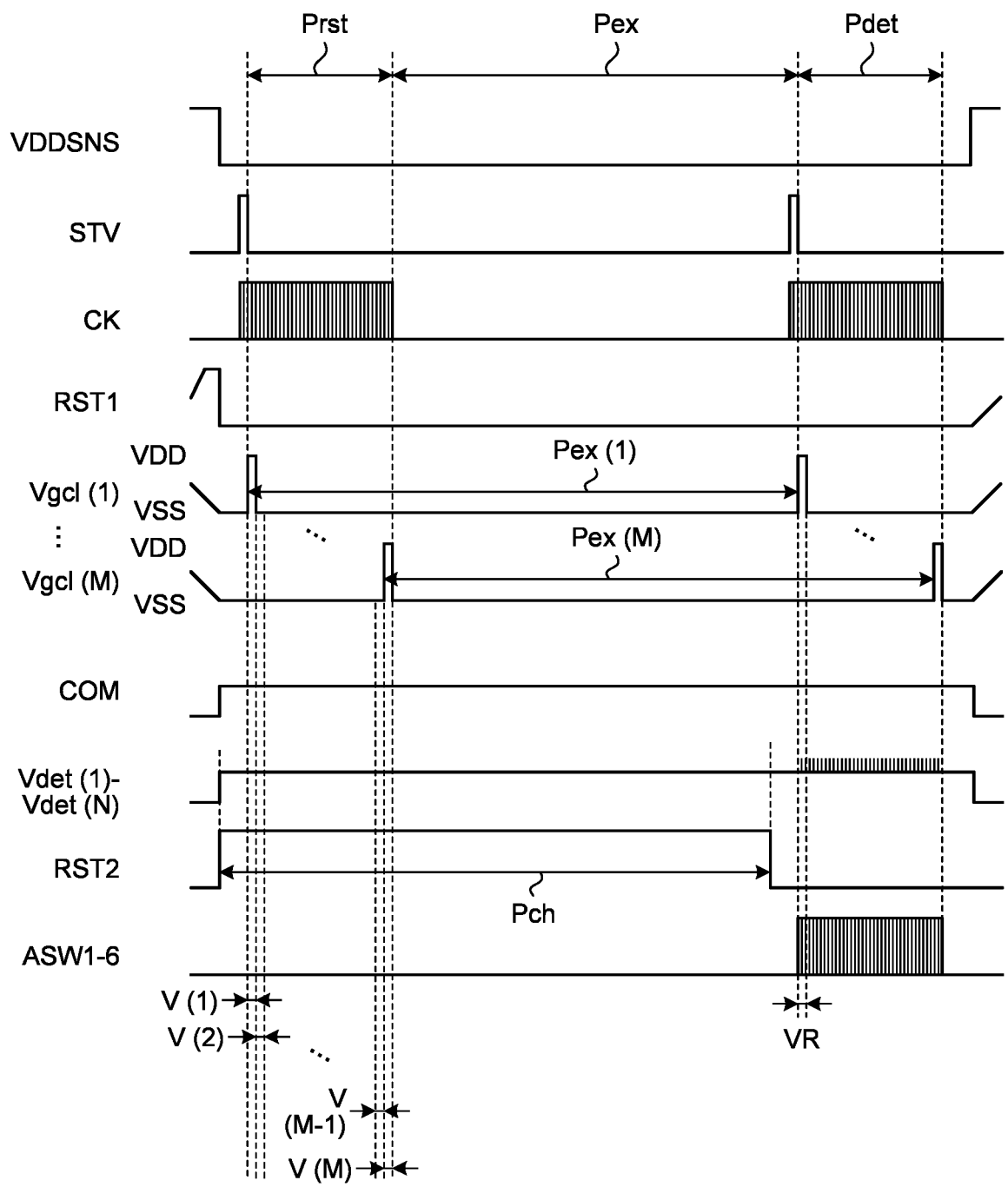
FIG. 6 is a timing waveform diagram illustrating an operation example of the detection device.
Figure 7:
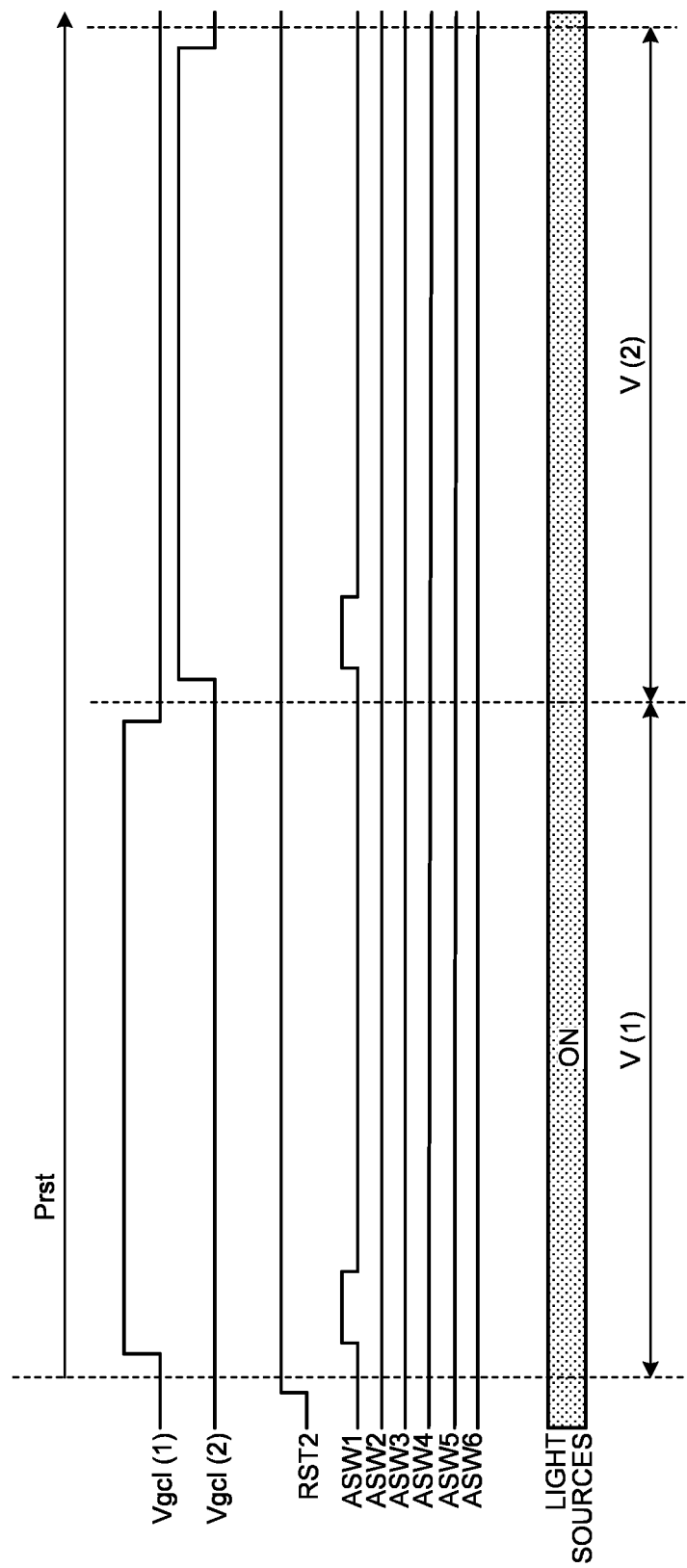
FIG. 7 is a timing waveform diagram illustrating an operation example during a reset period in FIG. 6.
Figure 8:
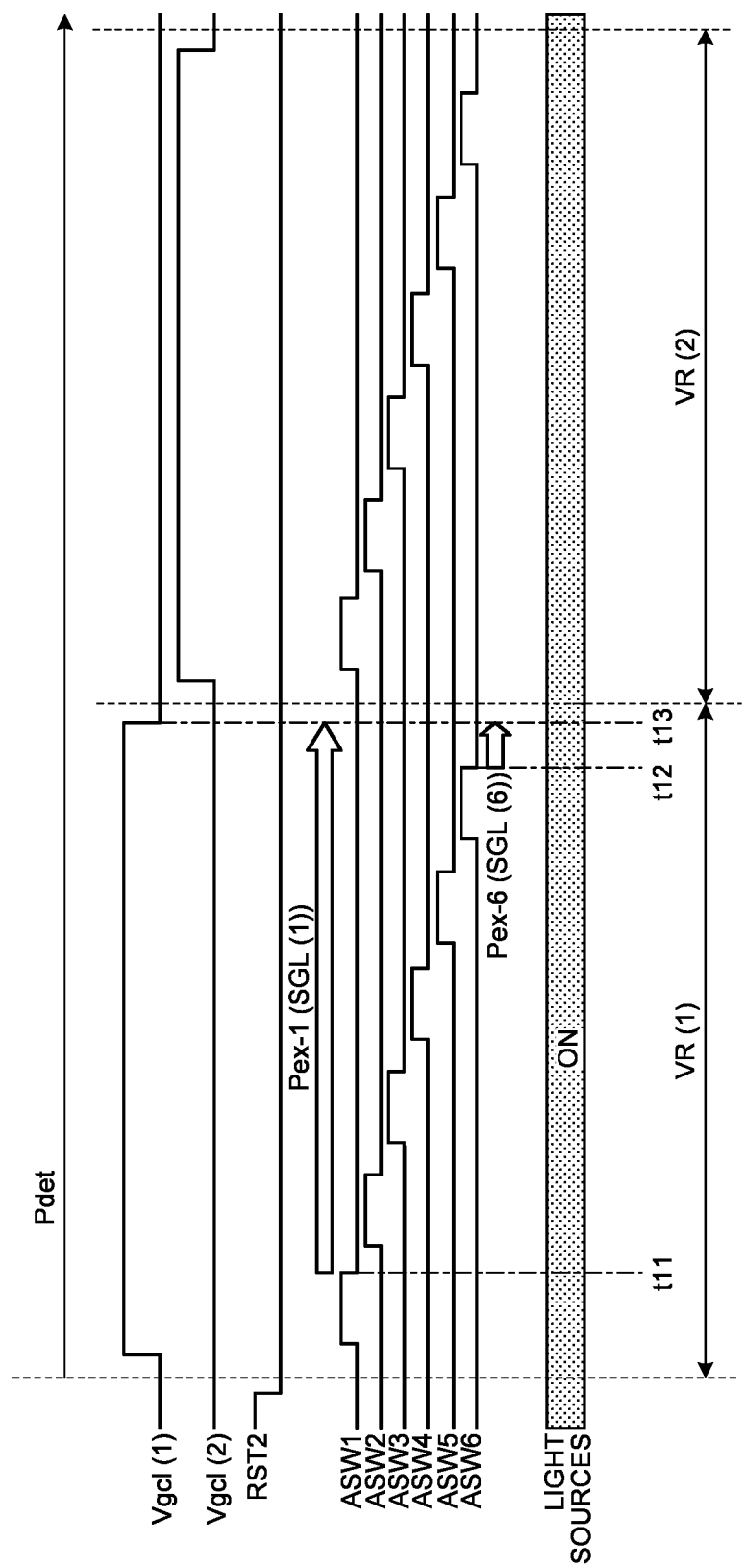
FIG. 8 is a timing waveform diagram illustrating an operation example during a reading period in FIG. 6.
Figure 9:
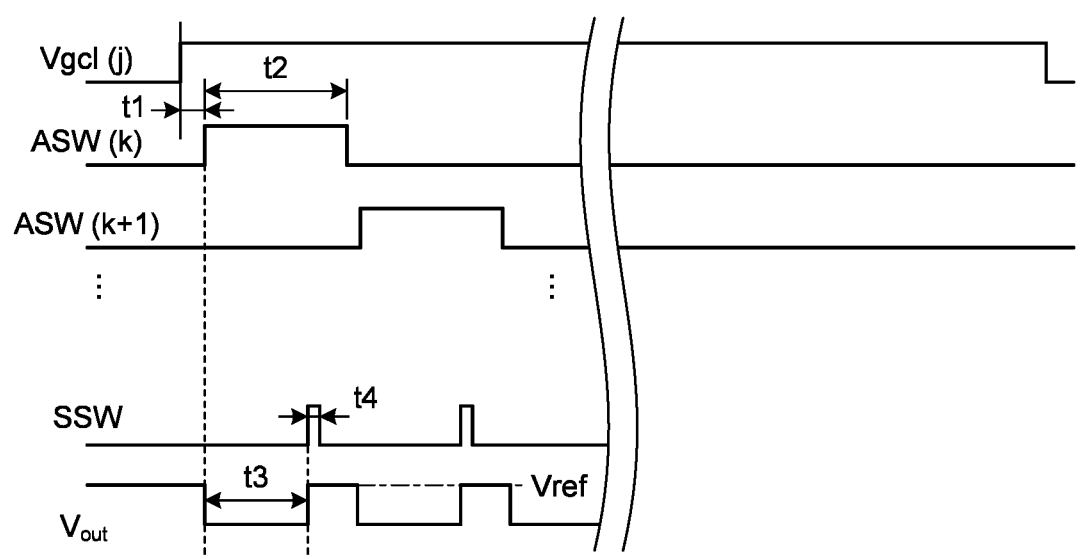
FIG. 9 is a timing waveform diagram illustrating an operation example during a period of driving one gate line included in the reading period in FIG. 6.
Figure 10:
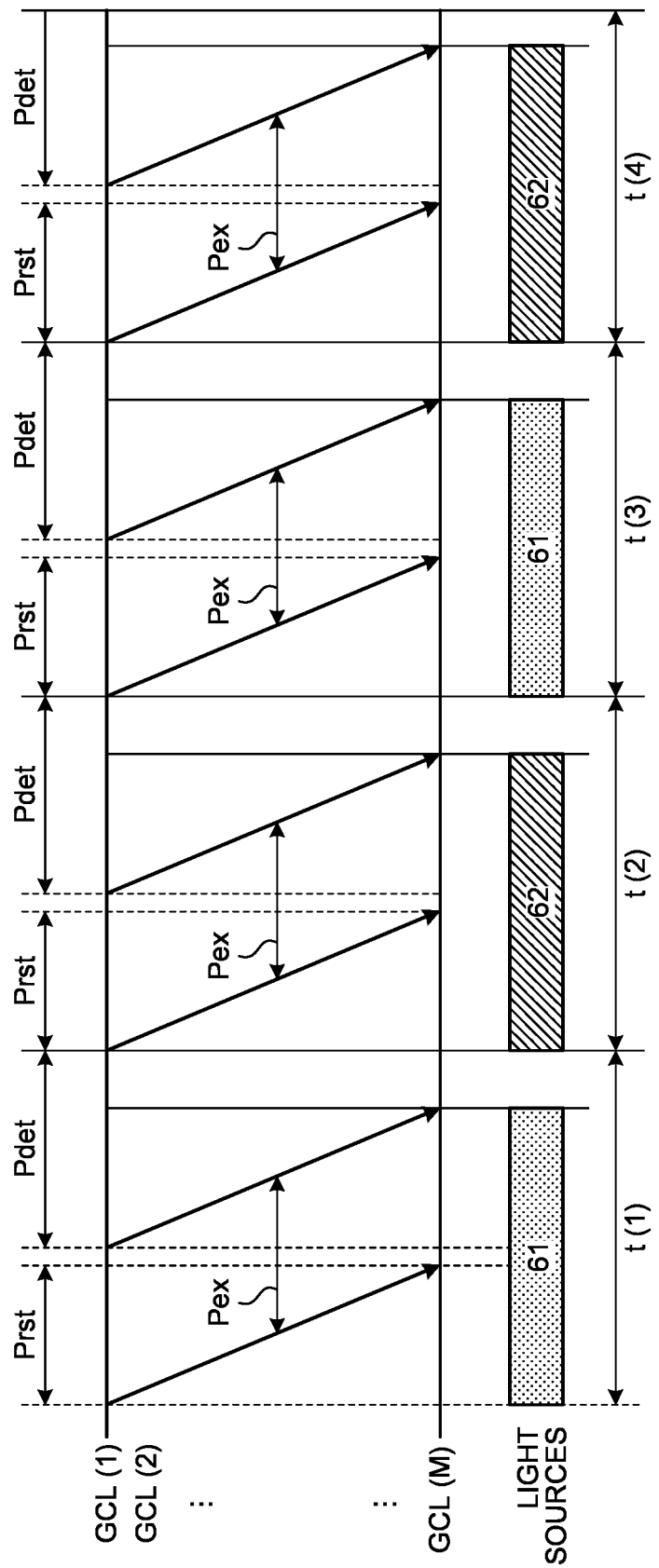
FIG. 10 is an explanatory diagram for explaining a relation between driving of the sensor area of the detection device and lighting operations of light sources.

The following describes an operation example of the detection device 1. FIG. 6 is a timing waveform diagram illustrating the operation example of the detection device. FIG. 7 is a timing waveform diagram illustrating an operation example during the reset period in FIG. 6. FIG. 8 is a timing waveform diagram illustrating an operation example during the reading period in FIG. 6. FIG. 9 is a timing waveform diagram illustrating an operation example during a period of driving one gate line included in a row reading period VR in FIG. 6. FIG. 10 is an explanatory diagram for explaining a relation between driving of the sensor area of the detection device and lighting operations of the light sources.

As illustrated in FIG. 6, the detection device 1 includes the reset period Prst, an exposure period Pex, and the reading period Pdet. The power supply circuit 123 supplies the sensor power supply signal VDDSNS to the anode of the photosensor PD over the reset period Prst, the exposure period Pex, and the reading period Pdet. The sensor power supply signal VDDSNS is a signal that applies a reverse bias between the anode and the cathode of the photosensor PD. For example, the reference signal COM of substantially 0.75 V is applied to the cathode of the photosensor PD, and the sensor power supply signal VDDSNS of substantially −1.25 V is applied to the anode thereof. As a result, a reverse bias of substantially 2.0 V is applied between the anode and the cathode. The control circuit 122 sets the reset signal RST2 to "H", and then, supplies the start signal STV and the clock signal CK to the gate line drive circuit 15 to start the reset period Prst. During the reset period Prst, the control circuit 122 supplies the reference signal COM to the reset circuit 17, and uses the reset signal RST2 to turn on the fourth switching elements TrR for supplying a reset voltage. This operation supplies the reference signal COM as the reset voltage to each of the signal lines SGL. The reference signal COM is set to, for example, 0.75 V.

During the reset period Prst, the gate line drive circuit 15 sequentially selects the gate lines GCL based on the start signal STV, the clock signal CK, and the reset signal RST1. The gate line drive circuit 15 sequentially supplies the gate drive signals Vgcl {Vgcl(1), . . . , Vgcl(M)} to the gate lines GCL. The gate drive signal Vgcl has a pulsed waveform having a power supply voltage VDD serving as a high-level voltage and a power supply voltage VSS serving as a low-level voltage. In FIG. 6, M (where M is, for example, 256) of the gate lines GCL are provided, and the gate drive signals Vgcl(1), . . . , Vgcl(M) are sequentially supplied to the respective gate lines GCL. Thus, the first switching elements Tr are sequentially brought into a conducting state and supplied with the reset voltage on a row-by-row basis. For example, a voltage of 0.75 V of the reference signal COM is supplied as the reset voltage.

Specifically, as illustrated in FIG. 7, the gate line drive circuit 15 supplies the gate drive signal Vgcl(1) at the high-level voltage (power supply voltage VDD) to the gate line GCL(1) during a period V(1). The control circuit 122 supplies any one of selection signals ASW1, . . . , ASW6 (selection signal ASW1 in FIG. 7) to the signal line selection circuit 16 during a period in which the gate drive signal Vgcl(1) is at the high-level voltage (power supply voltage VDD). This operation couples the signal line SGL of the partial detection area PAA selected by the gate drive signal Vgcl(1) to the detection circuit 48. As a result, the reset voltage (reference signal COM) is also supplied to coupling wiring between the third switching element TrS and the detection circuit 48.

In the same manner, the gate line drive circuit 15 supplies the gate drive signals Vgcl(2), . . . , Vgcl(M−1), Vgcl(M) at the high-level voltage to gate lines GCL(2), . . . , GCL(M−1), GCL(M) during periods V(2), . . . , V(M−1), V(M), respectively.

Thus, during the reset period Prst, the capacitive elements Ca of all the partial detection areas PAA are sequentially electrically coupled to the signal lines SGL, and are supplied with the reference signal COM. As a result, the capacities of the capacitive elements Ca are reset. The capacities of the capacitive elements Ca of some of the partial detection areas PAA can be reset by partially selecting the gate lines and the signal lines SGL.

Examples of the exposure timing include a control method of exposure during non-selection of gate lines and a full-time control method of exposure. In the control method of exposure during non-selection of gate lines, the gate drive signals {Vgcl(1), . . . , Vgcl(M)} are sequentially supplied to all the gate lines GCL coupled to the photosensors PD serving as the detection targets, and all the photosensors PD serving as the detection targets are supplied with the reset voltage. Then, after all the gate lines GCL coupled to the photosensors PD serving as the detection targets are set to a low voltage (the first switching elements Tr are turned off), the exposure starts and the exposure is performed during the exposure period Pex. After the exposure ends, the gate drive signals {Vgcl(1), . . . , Vgcl(M)} are sequentially supplied to the gate lines GCL coupled to the photosensors PD serving as the detection targets as described above, and reading is performed during the reading period Pdet. In the full-time control method of exposure, control for performing the exposure can also be performed during the reset period Prst and the reading period Pdet (full-time exposure control). In this case, the exposure period Pex(1) starts after the gate drive signal Vgcl(1) is supplied to the gate line GCL during the reset period Prst. The term "exposure periods Pex {(1), . . . , (M)}" refers to periods during which the capacitive elements Ca are charged from the photosensors PD. The electrical charge stored in the capacitive element Ca during the reset period Prst causes a reverse directional current (from cathode to anode) to flow through the photosensor PD due to light irradiation, and the potential difference across the capacitive element Ca decreases. The start timing and the end timing of the actual exposure periods Pex(1), . . . , Pex(M) are different among the partial detection areas PAA corresponding to the respective gate lines GCL. Each of the exposure periods Pex(1), . . . , Pex(M) starts when the gate drive signal Vgcl changes from the power supply voltage VDD serving as the high-level voltage to the power supply voltage VSS serving as the low-level voltage during the reset period Prst. Each of the exposure periods Pex(1), . . . , Pex(M) ends when the gate drive signal Vgcl changes from the power supply voltage VSS to the power supply voltage VDD during the reading period Pdet. The lengths of the exposure time of the exposure periods Pex(1), . . . , Pex(M) are equal.

In the control method of exposure during non-selection of gate lines, a current flows correspondingly to the light irradiating the photosensor PD in each of the partial detection areas PAA during the exposure periods Pex {(1), . . . , (M)}. As a result, an electrical charge is stored in each of the capacitive elements Ca.

At a time before the reading period Pdet starts, the control circuit 122 sets the reset signal RST2 to a low-level voltage. This operation stops operation of the reset circuit 17. The reset signal may be set to a high-level voltage only during the reset period Prst. During the reading period Pdet, the gate line drive circuit 15 sequentially supplies the gate drive signals Vgcl(1) . . . , Vgcl(M) to the gate lines GCL in the same manner as during the reset period Prst.

Specifically, as illustrated in FIG. 8, the gate line drive circuit 15 supplies the gate drive signal Vgcl(1) at the high-level voltage (power supply voltage VDD) to the gate line GCL(1) during a row reading period VR(1). The control circuit 122 sequentially supplies the selection signals ASW1, . . . , ASW6 to the signal line selection circuit 16 during a period in which the gate drive signal Vgcl(1) is at the high-level voltage (power supply voltage VDD). This operation sequentially or simultaneously couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the gate line drive circuit 15 supplies the gate drive signals Vgcl(2), . . . , Vgcl(M−1), Vgcl(M) at the high-level voltage to the gate lines GCL(2), . . . , GCL(M−1), GCL(M) during row reading periods VR(2), . . . , VR(M−1), VR(M), respectively. That is, the gate line drive circuit 15 supplies the gate drive signal Vgcl to the gate line GCL during each of the row reading periods VR(1), VR(2), . . . , VR(M−1), VR(M). The signal line selection circuit 16 sequentially selects the signal lines SGL based on the selection signal ASW during each period in which the gate drive signal Vgcl is set to the high-level voltage. The signal line selection circuit 16 sequentially couples each of the signal lines SGL to one detection circuit 48. Thus, the detection device 1 can output the detection signals Vdet of all the partial detection areas PAA to the detection circuit 48 during the reading period Pdet.

With reference to FIG. 9, the following describes the operation example during the row reading period VR that is a supply period of one of the gate drive signals Vgcl(j) in FIG. 6. In FIG. 6, the reference sign of the row reading period VR is assigned to the first gate drive signal Vgcl(1). The same applies to the other gate drive signals Vgcl(2) . . . , Vgcl(M). The index j is any one of the natural numbers 1 to M.

As illustrated in FIGS. 9 and 4, an output (Vout) of each of the third switching elements TrS has been reset to the reference potential (Vref) voltage in advance. The reference potential (Vref) voltage serves as a reset voltage, and is set to, for example, 0.75 V. Then, the gate drive signal Vgcl(j) is set to a high level, and the first switching elements Tr of a corresponding row are turned on. Thus, each of the signal lines SGL of each row is set to a voltage corresponding to the electrical charge stored in the capacity (capacitive element Ca) of the partial detection area PAA. After a period t1 elapses from a rising edge of the gate drive signal Vgcl(j), a period t2 occurs in which the selection signal ASW(k) is set to a high level. After the selection signal ASW(k) is set to the high level to turn on the third switching element TrS, the electrical charge stored in the capacity (capacitive element Ca) of the partial detection area PAA coupled to the detection circuit 48 through the third switching element TrS changes the output (Vout) of the third switching element TrS (refer to FIG. 4) to a voltage corresponding to the electrical charge stored in the capacity (capacitive element Ca) of the partial detection area PAA (period t3). In the example of FIG. 9, this voltage is reduced from the reset voltage as illustrated in the period t3. Then, after the switch SSW is turned on (period t4 during which an SSW signal is set to a high level), the electrical charge stored in the capacity (capacitive element Ca) of the partial detection area PAA moves to the capacity (capacitive element Cb) of the detection signal amplifier 42 of the detection circuit 48, and the output voltage of the detection signal amplifier 42 is set to a voltage corresponding to the electrical charge stored in the capacitive element Cb. At this time, the potential of an inverting input portion of the detection signal amplifier 42 is set to an imaginary short-circuit potential of the operational amplifier, and therefore, returns to the reference potential (Vref). The A/D converter 43 reads the output voltage of the detection signal amplifier 42. In the example of FIG. 9, waveforms of the selection signals ASW(k), ASW(k+1), . . . corresponding to the signal lines SGL of the respective columns are set to a high level to sequentially turn on the third switching elements TrS, and the same operation is sequentially performed. This operation sequentially reads the electrical charges stored in the capacities (capacitive elements Ca) of the partial detection areas PAA coupled to the gate line GCL. ASW(k), ASW(k+1), . . . in FIG. 9 are, for example, any of ASW1 to ASW6 in FIG. 9.

Specifically, when the period t4 occurs in which the switch SSW is turned on, the electrical charge moves from the capacity (capacitive element Ca) of the partial detection area PAA to the capacity (capacitive element Cb) of the detection signal amplifier 42 of the detection circuit 48. At this time, the non-inverting input (+) of the detection signal amplifier 42 is biased to the reference potential (Vref) voltage (for example, 0.75 V). As a result, the output (Vout) of the third switching element TrS is also set to the reference potential (Vref) voltage due to the imaginary short-circuit between input ends of the detection signal amplifier 42. The voltage of the capacitive element Cb is set to a voltage corresponding to the electrical charge stored in the capacity (capacitive element Ca) of the partial detection area PAA at a location where the third switching element TrS is turned on in response to the selection signal ASW(k). After the output (Vout) of the third switching element TrS is set to the reference potential (Vref) voltage due to the imaginary short-circuit, the output of the detection signal amplifier 42 reaches a voltage corresponding to the capacity of the capacitive element Cb, and this output voltage is read by the A/D converter 43. The voltage of the capacitive element Cb is, for example, a voltage between two electrodes provided on a capacitor constituting the capacitive element Cb.

The period t1 is, for example, 20 μs. The period t2 is, for example, 60 μs. The period t3 is, for example, 44.7 μs. The period t4 is, for example, 0.98 μs.

As illustrated in FIG. 10, the detection device 1 performs the processing in the reset period Prst, the exposure periods Pex {(1), . . . , (M)}, and the reading period Pdet described above in each of a period t(1), a period t(2), a period t(3), and a period t(4). In the reset period Prst and the reading period Pdet, the gate line drive circuit 15 sequentially scans the gate lines GCL(1) to GCL(M). In the following description, "detection of one frame" denotes the detection in each period t, that is, the detection for acquiring the detection signals Vdet from the signal lines SGL in the respective columns by scanning the gate lines GCL(1) to GCL(M) in the reset period Prst and the reading period Pdet.

The control circuit 122 can control the lighting and the non-lighting of the light sources according to the detection target. FIG. 10 illustrates an example in which the first light sources 61 are turned on during the periods t(1) and t(3), and the second light sources 62 are turned on during the periods t(2) and t(4). That is, in the example illustrated in FIG. 10, the control circuit 122 alternately switches the first light sources 61 and the second light sources 62 on and off for each detection of one frame. The present invention is not limited to this example. For example, the control circuit 122 may switch the first light sources 61 and the second light sources 62 on and off at intervals of a predetermined period of time, or may continuously turn on either of the first and the second light sources 61 and 62.

Although FIGS. 6 to 10 illustrate the example in which the gate line drive circuit 15 individually selects the gate line GCL, the present invention is not limited to this example. The gate line drive circuit 15 may simultaneously select a predetermined number (two or more) of the gate lines GCL, and sequentially supply the gate drive signals Vgcl to each unit of the predetermined number of the gate lines GCL. The signal line selection circuit 16 may also simultaneously couple a predetermined number (two or more) of the signal lines SGL to one detection circuit 48. Moreover, the gate line drive circuit 15 may thin out some of the gate lines GCL and scan the remaining ones.

As illustrated in FIG. 8, in the row reading period VR(1), the selection signals ASW1, ..., ASW6 are sequentially supplied to the signal line selection circuit 16 during the period in which the gate drive signal Vgcl(1) is at the high-level voltage (power supply voltage VDD). That is, even after the selection signal ASW1 is set to a low-level voltage at time t11, the exposure continues during an exposure period Pex-1 until the gate drive signal Vgcl(1) is set to the low-level voltage at time t13. An electrical charge corresponding to the exposure period Pex-1 is supplied from the photosensor PD to the signal line SGL(1) corresponding to the selection signal ASW1.

In the same manner, an electrical charge is supplied to each of the signal lines SGL during a corresponding one of exposure periods Pex-1, ..., Pex-6 corresponding to the selection signals ASW1, ..., ASW6, respectively. For example, the exposure period Pex-6 is a period after the selection signal ASW6 is set to the low-level voltage at time t12 until the gate drive signal Vgcl (1) is set to the low-level voltage at time t13, and the exposure period Pex differs column by column.

In the next row reading period VR(2), the detection circuit 48 is supplied with a signal obtained by adding an electrical charge stored during the exposure periods Pex-1 (SGL(1)), ..., Pex-6(SGL(6)) of the previous row reading period VR(1) to the detection signal Vdet of the second row.

As described above, in the present disclosure, the length of the FPC 71 can be changed according to the use conditions and the applications of the detection device 1. For example, the length of FPC 71 needs to be optimized according to the following conditions: whether the detection target is the finger Fg or the wrist; whether the biological information is acquired in a clinical setting or when a subject is exercising; the difference in physique of the subject, and moreover, the overall configuration of a system in which the detection device 1 is used.

Figure 11:
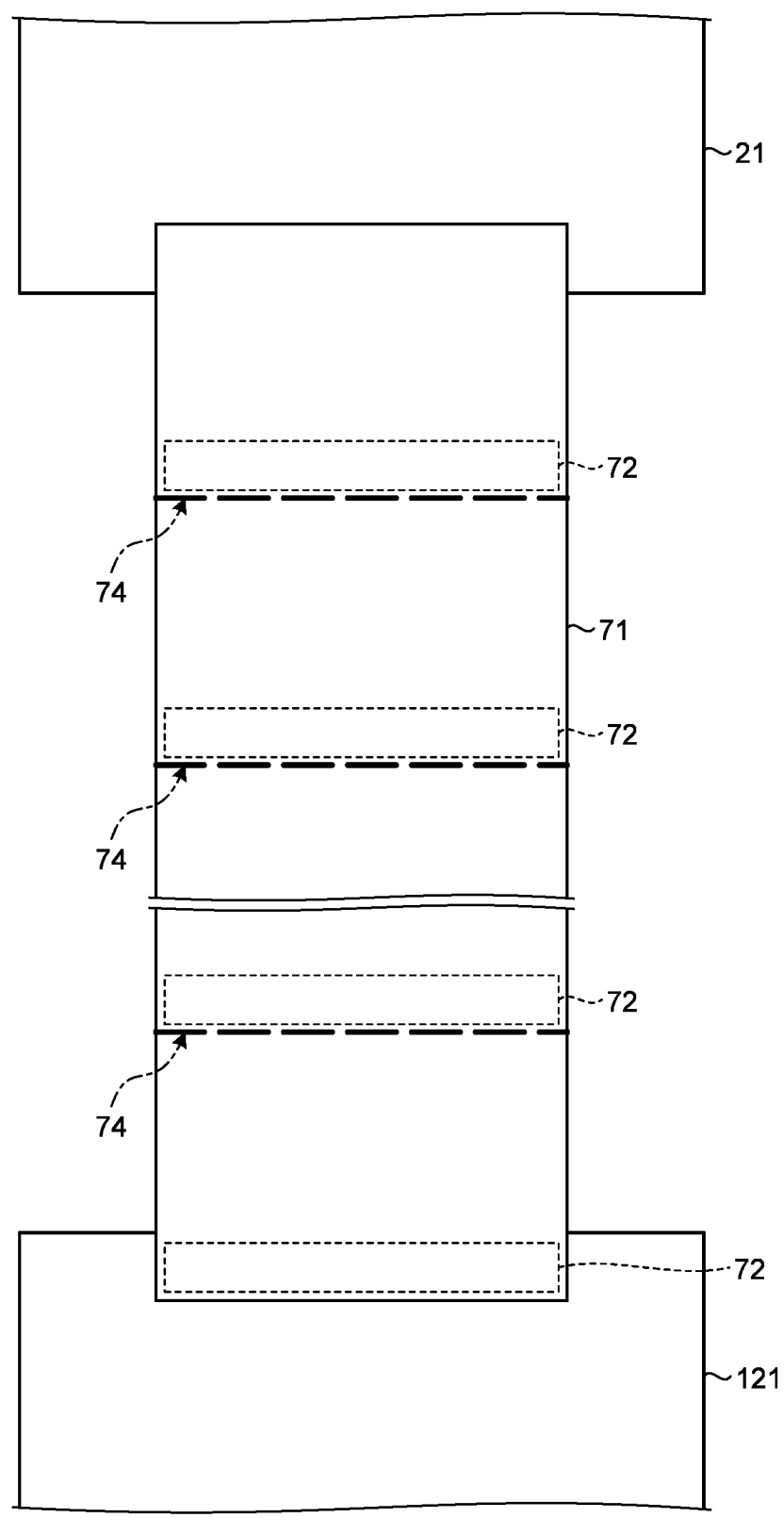
FIG. 11 is a schematic diagram illustrating an exemplary configuration that makes the length of an FPC changeable in the detection device according to the embodiment.

The following describes a configuration that makes the length of the FPC 71 of the detection device 1 changeable. FIG. 11 is a schematic diagram illustrating an example of the configuration that makes the length of the FPC changeable in the detection device according to the embodiment.

As illustrated in FIG. 11, in the present embodiment, cutting indication lines 74 that indicate that the FPC 71 can be cut there are provided at a plurality of locations on the FPC 71 of the detection device 1 between the sensor substrate 21 and the control board 121. The FPC 71 is provided with a terminal 72 for each of the cutting indication lines 74. Specifically, the terminals 72 for coupling to the control board 121 are provided at an end on the control board 121 side of the FPC 71, and on the sensor substrate 21 sides of the cutting indication lines 74, that is, at locations serving as ends on the control board 121 side of the FPC 71 when cut at the cutting indication lines 74. In an aspect of the present invention, each of the cutting indication lines 74 may be printed on the FPC 71 with a screen printing technique.

Figure 12A:
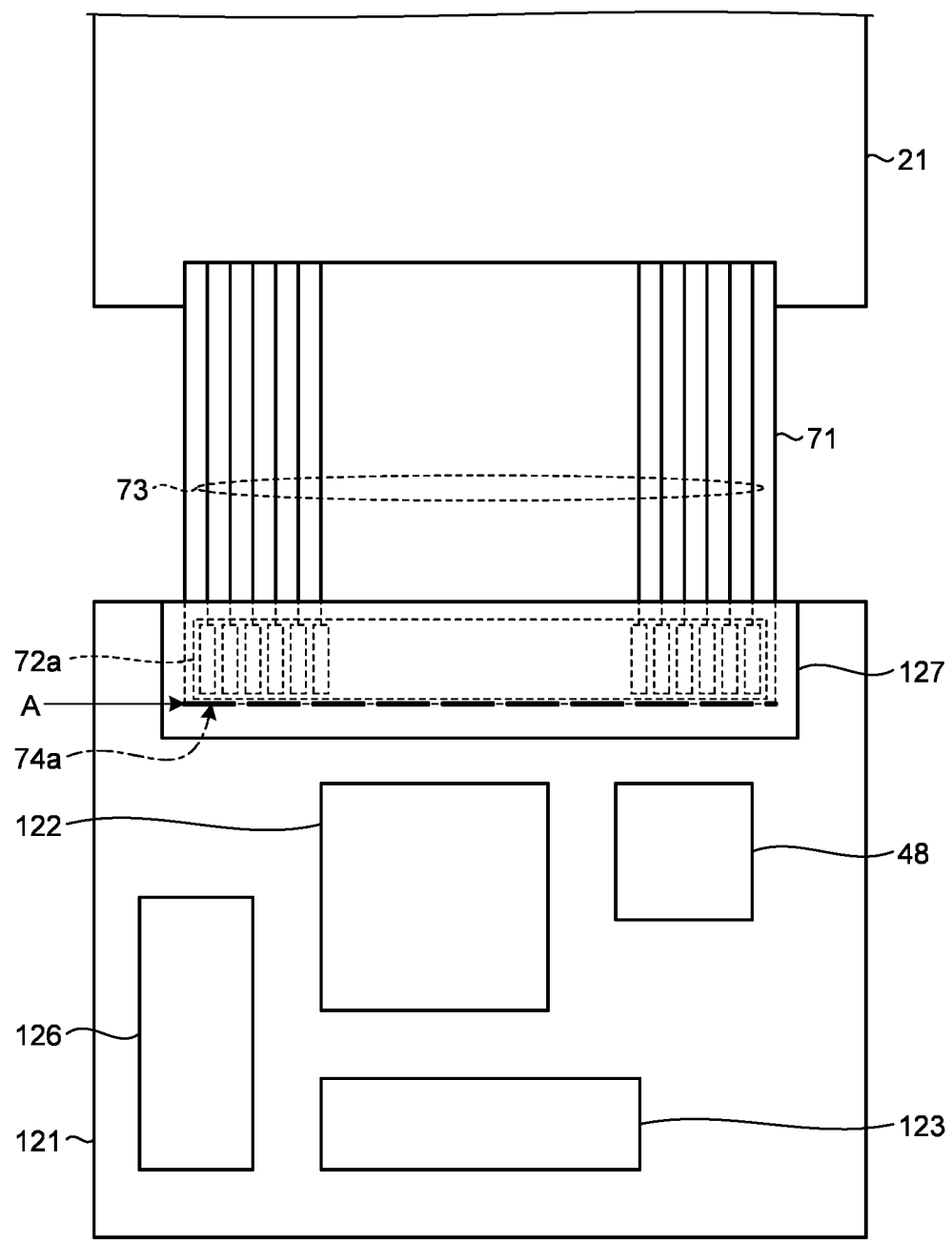
FIG. 12A is a diagram illustrating a first coupling example between the FPC and a control board.

FIG. 12A is a diagram illustrating a first coupling example between the FPC and the control board. FIG. 12A illustrates the example in which the FPC 71 is cut at a cutting indication line 74a, and is coupled to the control board 121.

Pieces of wiring (not illustrated) of the sensor substrate 21 are electrically coupled to pieces of wiring 73 of the FPC 71 using, for example, an anisotropic conductive film (ACF).

The control board 121 is provided with a connector 127. The terminals 72 (terminals 72a in FIG. 12) at an end of the FPC 71 are plugged into the connector 127 to couple the FPC 71 to the control board 121. Specifically, the terminals 72 (terminals 72a in FIG. 12) provided at the pieces of the wiring 73 of the FPC 71 come into contact with contact points (not illustrated) of the connector 127 to electrically couple pieces of wiring (not illustrated) of the control board 121 to the pieces of the wiring 73 of the FPC 71.

The pieces of the wiring 73 of the FPC 71 are electrically coupled to components of the control board 121. Specifically, the pieces of the wiring 73 of the FPC 71 are coupled to the detection circuit 48, the control circuit 122, the power supply circuit 123, and the output circuit 126 through the respective contact points of the connector 127.

Figure 12B:
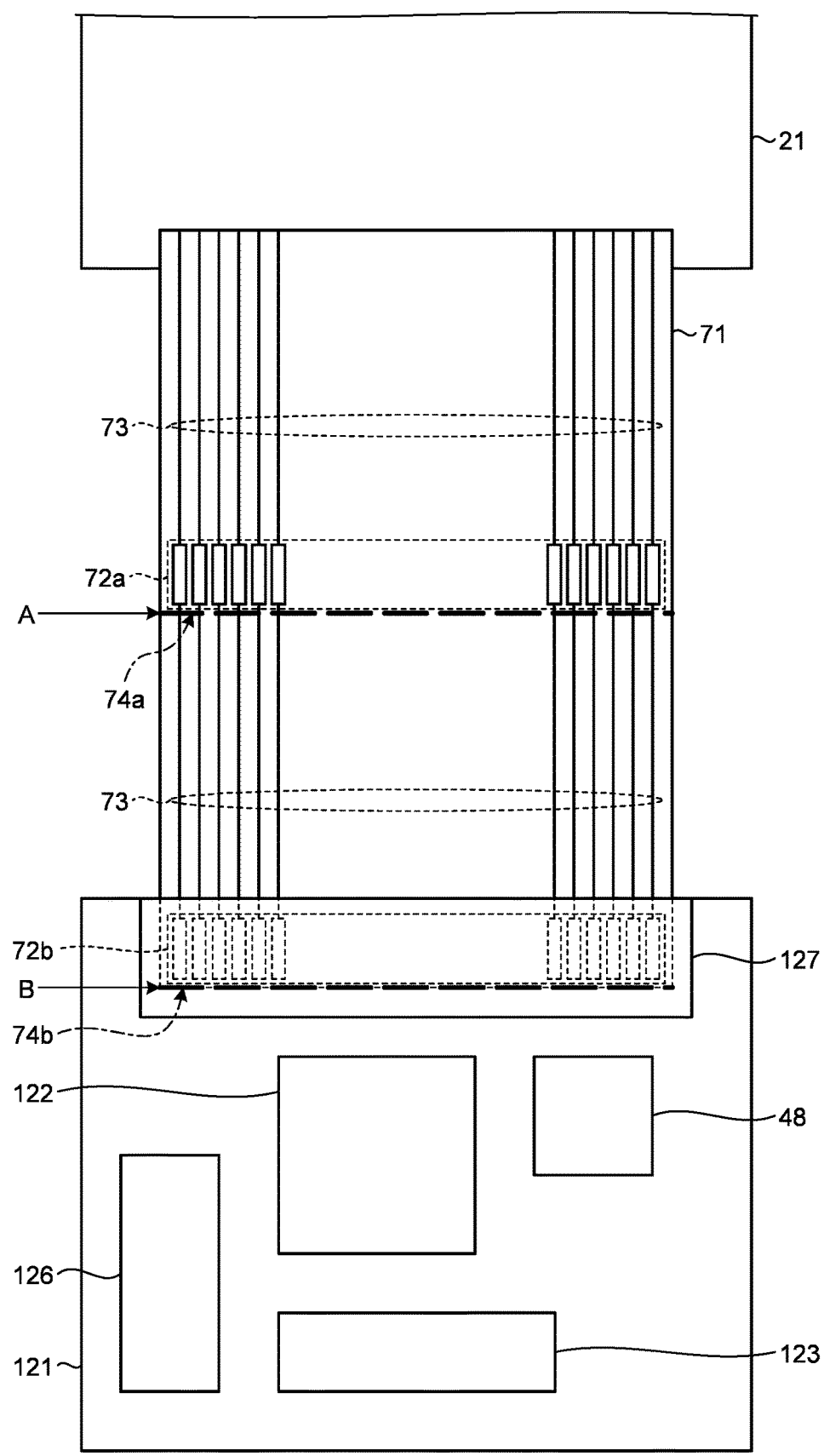
FIG. 12B is a diagram illustrating a second coupling example between the FPC and the control board.

FIG. 12B is a diagram illustrating a second coupling example between the FPC and the control board. FIG. 12B illustrates the example in which the FPC 71 is cut at a cutting indication line 74b, and is coupled to the control board 121.

Figure 12C:
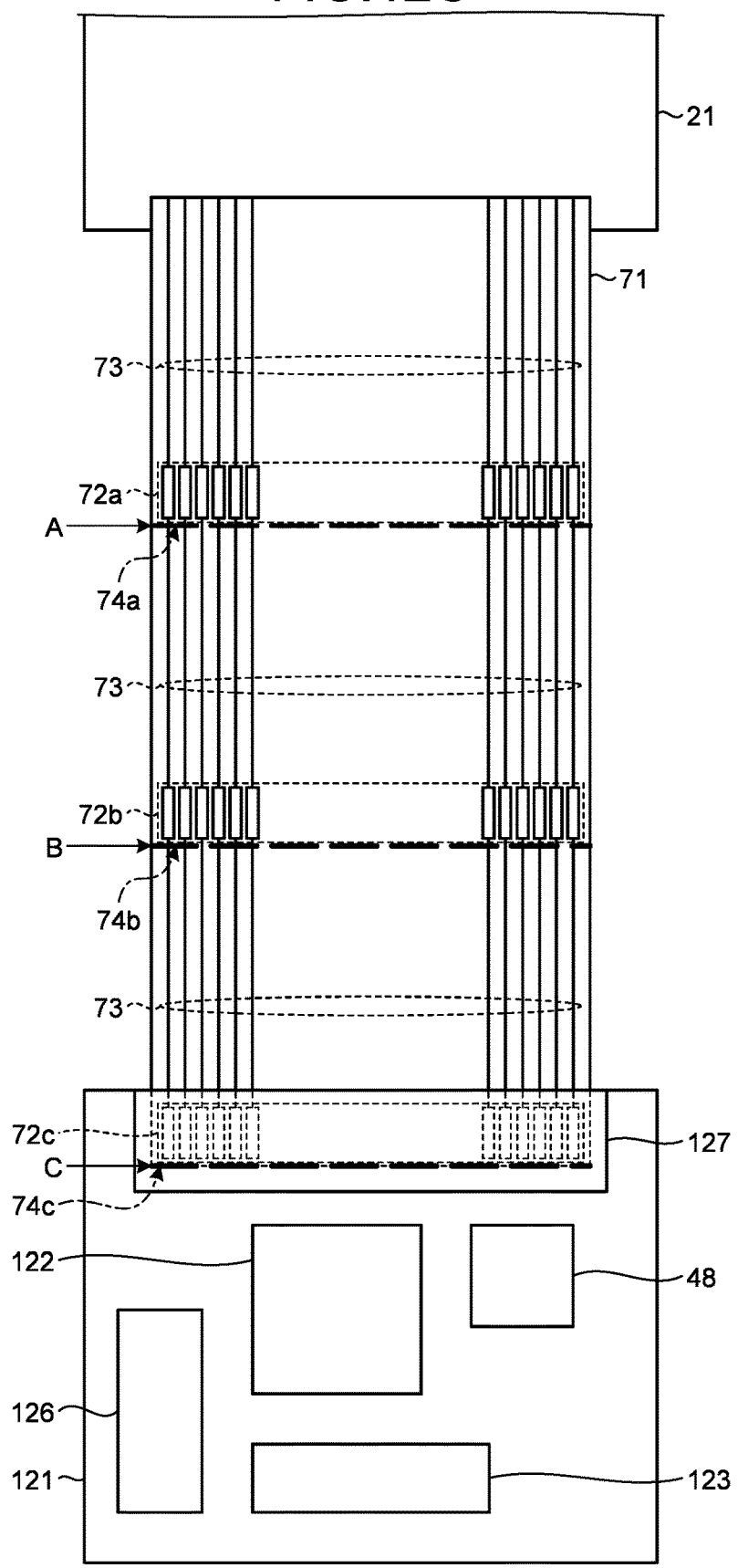
FIG. 12C is a diagram illustrating a third coupling example between the FPC and the control board.

FIG. 12C is a diagram illustrating a third coupling example between the FPC and the control board. FIG. 12C illustrates the example in which the FPC 71 is cut at a cutting indication line 74c, and is coupled to the control board 121.

FIG. 12D is a diagram illustrating a fourth coupling example between the FPC and the control board. FIG. 12D illustrates the example in which the FPC 71 is cut at a cutting indication line 74d, and is coupled to the control board 121.

The cutting indication lines 74 are provided at a plurality of locations between the sensor substrate 21 and the control board 121 of the FPC 71 of the detection device 1 as illustrated in FIG. 11, and the FPC 71 is cut at cutting parts A, B, C, and D along the cutting indication lines 74a, 74b, 74c, and 74d, respectively. Thereby, the length of the FPC 71 can be changed as illustrated in FIGS. 12A, 12B, 12C, and 12D. This method can optimize the length of the FPC 71 according to the use conditions of the detection device 1 and application portions when acquiring the biological information.

Figure 13A:
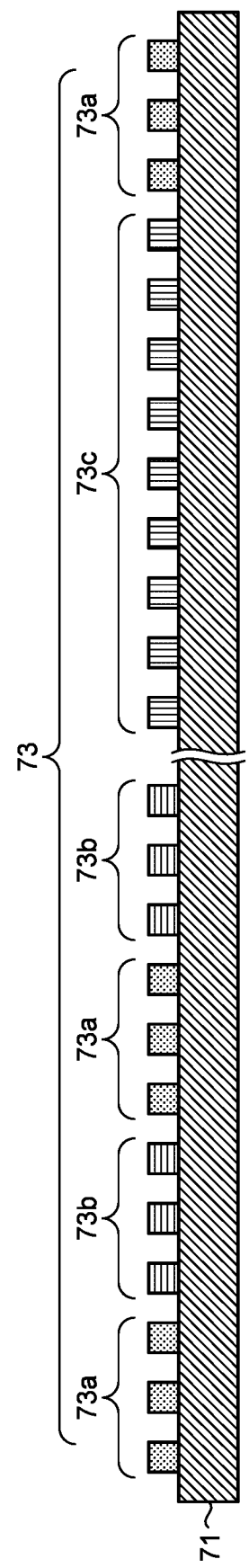
FIG. 13A is a diagram illustrating exemplary sectional views along respective cutting indication lines of the FPC.
Figure 13B:
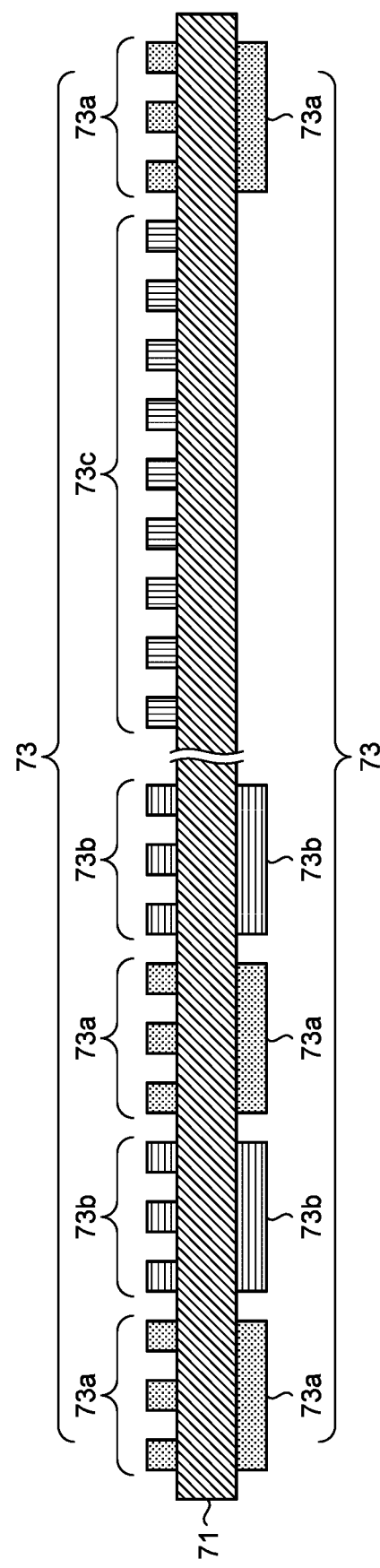
FIG. 13B is a diagram illustrating other exemplary sectional views along the respective cutting indication lines of the FPC.

FIGS. 13A and 13B are diagrams illustrating exemplary sectional views along the respective cutting indication lines of the FPC. FIG. 13A illustrates an example in which the pieces of the wiring 73 are provided on one surface of the FPC 71. FIG. 13B illustrates an example in which the pieces of the wiring 73 are provided on both surfaces of the FPC 71. In FIGS. 13A and 13B, pieces of wiring 73a represent ground wiring, and pieces of wiring 73b represent power supply wiring. Pieces of wiring 73c represent various types of signal wiring. The power supply wiring 73b includes, for example, wiring for the reference signal COM and the sensor power supply signal VDDSNS supplied from the power supply circuit 123 to the sensor area 10. The signal wiring 73c includes, for example, wiring for the detection signals Vdet of the photosensors PD output from the sensor area 10. For example, 70 to 80 wires of the signal wiring 73c that is used for coupling the sensor area 10 to the detection circuit 48 are provided within a width of 8 mm.

If the pieces of the wiring 73 are provided on both surfaces of the FPC 71, when the FPC 71 is cut along each of the cutting indication lines 74, the base material of the FPC 71 may be deformed to short-circuit the wires provided on each of the surfaces. As illustrated in FIG. 13B, by making the wires having the same potential face each other with the base material of the FPC 71 interposed therebetween, the wires having different potentials can be prevented from short-circuiting when the FPC 71 is cut. Specifically, as illustrated in FIG. 13B, for example, the ground wiring 73a is disposed on the back side of the ground wiring 73a, and the power supply wiring 73b is disposed on the back side of the power supply wiring 73b. In such an aspect of the present invention, the power supply wiring 73b provided on one surface of the FPC 71 and the ground wiring 73a provided on the other surface of the FPC 71 are arranged so as to be shifted from each other in the plan view. This configuration can prevent the power supply wiring 73b provided on one surface of the FPC 71 from short-circuiting to the ground wiring 73a provided on the other surface of the FPC 71 when the FPC 71 is cut.

FIG. 14 illustrates sectional views along the cutting indication lines. In an aspect of the present invention, as illustrated in FIG. 14, the cutting indication line 74 may be, for example, constituted by a row of dots that pass through the base material of the FPC 71 between the pieces of the wiring 73. In this case, as illustrated in FIG. 14, a distance S between adjacent dots d is preferably larger than a width W of the ground wiring 73a and the power supply wiring 73b, and at least one of the dots d is provided between the ground wiring 73a and the power supply wiring 73b. This configuration can prevent the ground wiring 73a and the power supply wiring 73b adjacent to each other from short-circuiting when the FPC 71 is cut along each of the cutting indication lines 74.

Figure 15A:
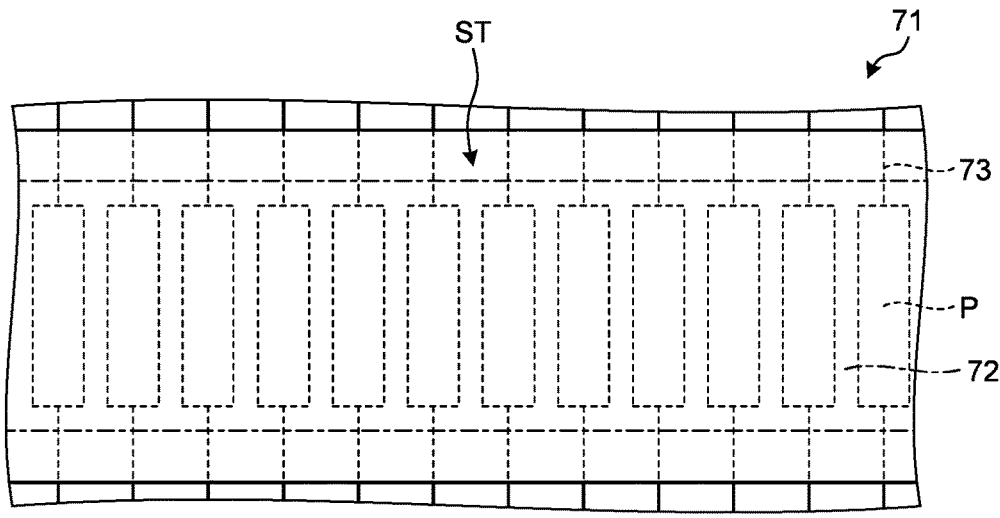
FIG. 15A is a diagram illustrating an arrangement example of pads provided on a terminal.
Figure 15B:
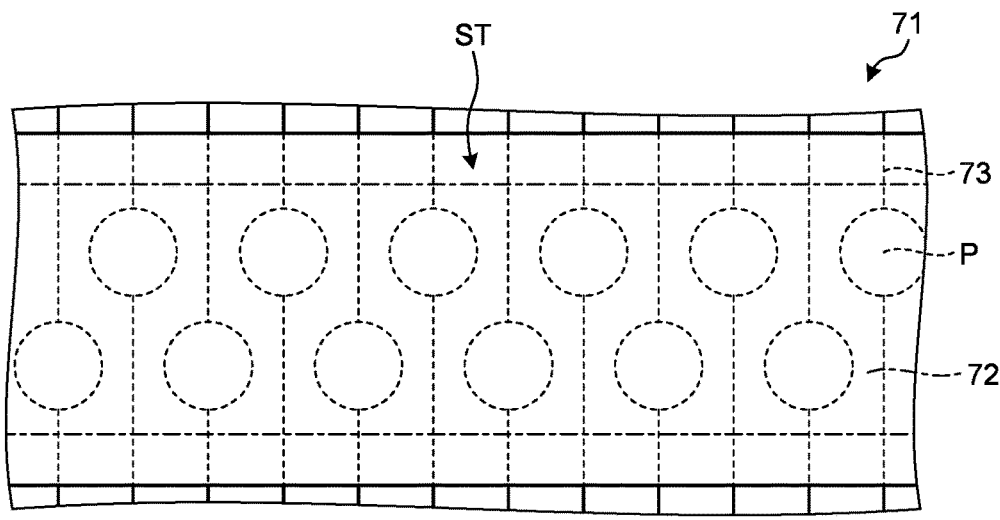
FIG. 15B is a diagram illustrating another arrangement example of the pads provided on the terminal.
Figure 15C:
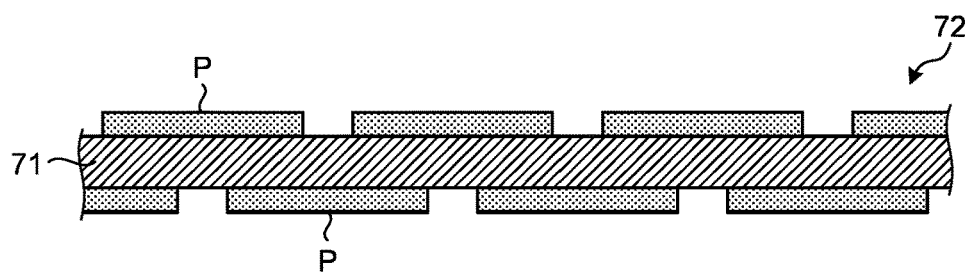
FIG. 15C is a diagram illustrating still another arrangement example of the pads provided on the terminal.

FIGS. 15A, 15B, and 15C are diagrams illustrating arrangement examples of the pads provided on the terminals. FIGS. 15A and 15B illustrate the arrangement examples of pads P when the FPC 71 is viewed from one side. FIG. 15C illustrates a sectional view along the cutting indication line 74 when the pads P are provided on both surfaces of the FPC 71.

In an aspect of the present invention, the pads P provided on the terminals 72 may be arranged, for example, in a row along the cutting indication line 74 as illustrated in FIG. 15A, or in another aspect of the present invention, may be arranged, for example, in a staggering manner along the cutting indication line 74 as illustrated in FIG. 15B. In still another aspect of the present invention, the pads P may be provided on both surfaces of the FPC 71 as illustrated in FIG. 15C. In a preferable aspect of the present invention, an insulating protective seal ST is attached to a surface of the terminal 72 on which the pads are arranged, as illustrated in FIGS. 15A and 15B. In addition, in still another aspect of the present invention, when the pads P are provided on both surfaces of the FPC 71, the pads P on both surfaces may be alternately arranged as illustrated in FIG. 15C. In an aspect of the present invention, an insulating material may be applied instead of attaching the insulating protective seal ST.

The wiring length between the sensor area 10 and the detection circuit 48 changes as the length of the FPC 71 changes. The capacitance element and the resistance element of the signal wiring 73c change as the wiring length between the sensor area 10 and the detection circuit 48 changes. Specifically, the capacitance element and the resistance element of the signal wiring 73c increase as the wiring length between the sensor area 10 and the detection circuit 48 increases. If the waveform of the signals output from the sensor area 10 changes as the capacitance element and the resistance element of the signal wiring 73c change, data values after being processed by the signal processor 44 of the control circuit 122 in the subsequent stage may be affected, and appropriate control may be disabled.

The following describes a configuration for the control circuit 122 to determine the cutting parts of the FPC 71 and perform the appropriate control.

Modification 1

Figure 16:
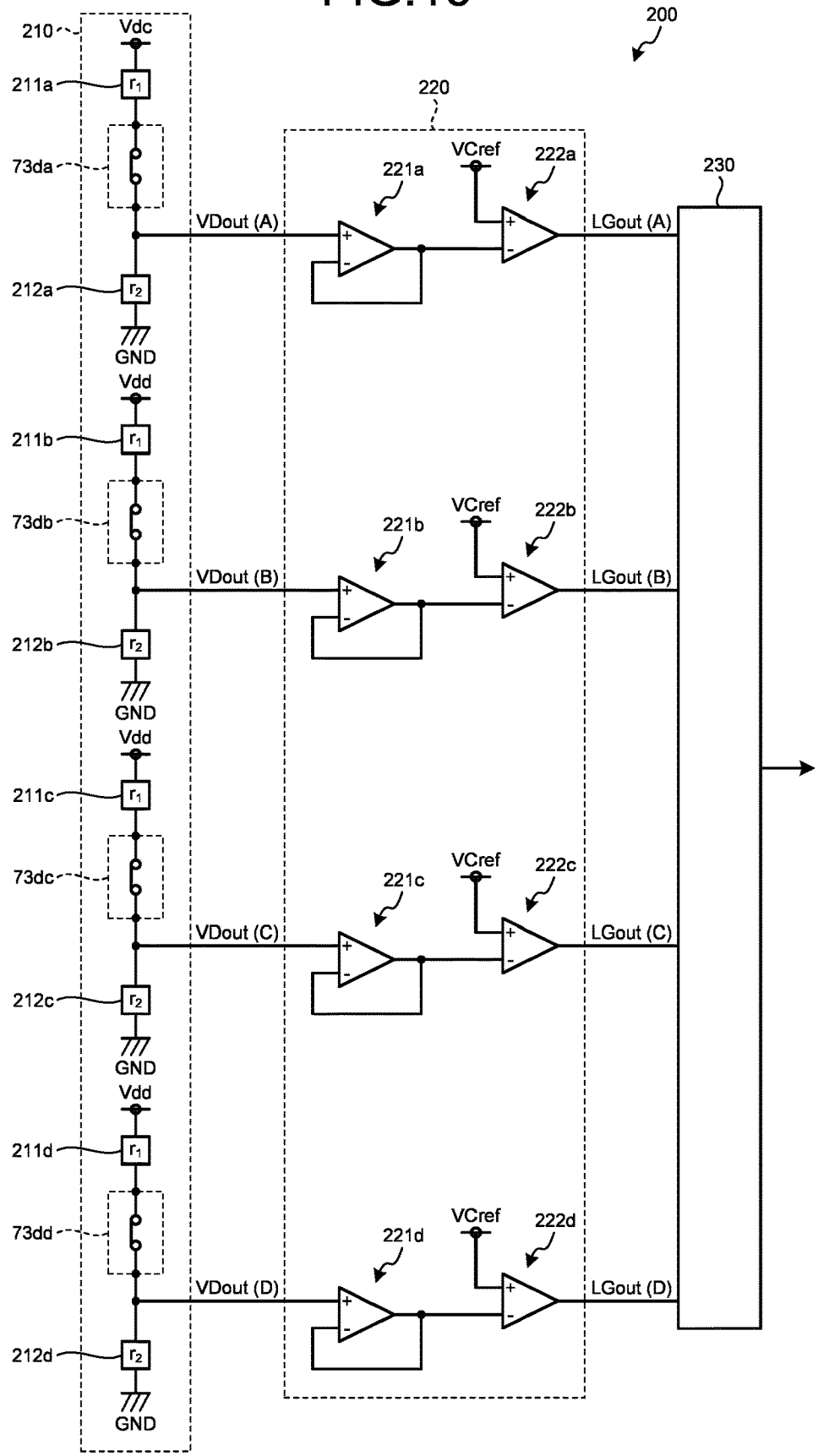
FIG. 16 is a diagram illustrating an exemplary block configuration of a cutting part determination circuit according to Modification 1.
Figure 17:
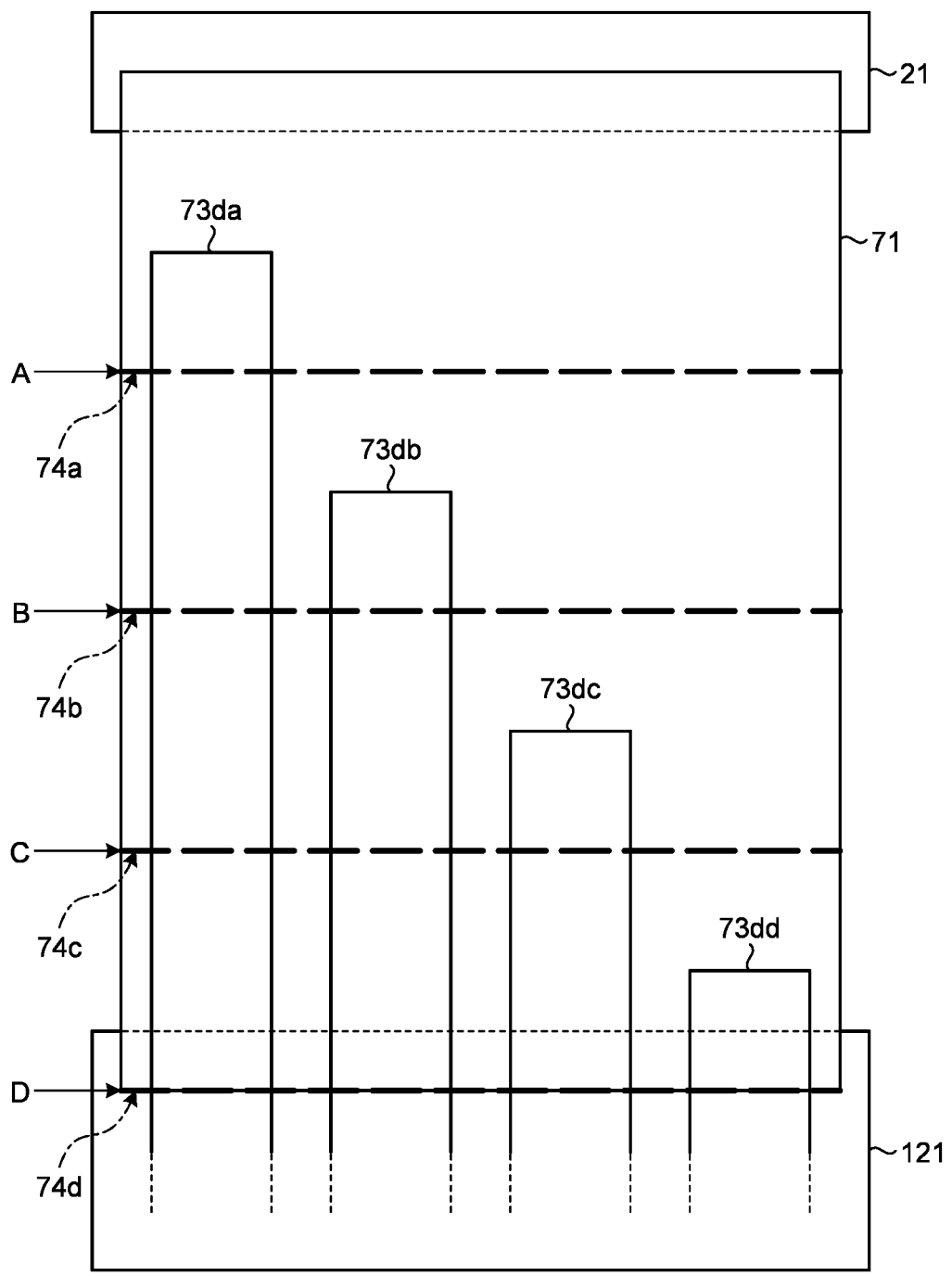
FIG. 17 is a diagram illustrating an example of cutting detection wires illustrated in FIG. 16.

FIG. 16 is a diagram illustrating an exemplary block configuration of a cutting part determination circuit according to Modification 1. FIG. 17 is a diagram illustrating an example of cutting detection wires illustrated in FIG. 16.

As illustrated in FIG. 16, a cutting part determination circuit 200 according to Modification 1 includes a cutting detector 210, a comparison unit (comparison circuit) 220, and a determination unit (determination circuit) 230.

The cutting detector 210 includes first resistors 211a, 211b, 211c, and 211d, second resistors 212a, 212b, 212c, and 212d, and cutting detection wires 73da, 73db, 73dc, and 73dd. In Modification 1, the first resistors 211a, 211b, 211c, and 211d and the second resistors 212a, 212b, 212c, and 212d are provided on the control board 121. In Modification 1, the first resistors 211a, 211b, 211c, and 211d have a resistance value of $r_1$, and the second resistors 212a, 212b, 212c, and 212d have a resistance value of $r_2$.

As illustrated in FIG. 17, the cutting detection wires 73da, 73db, 73dc, and 73dd are provided on the FPC 71 correspondingly to the cutting indication lines 74a, 74b, 74c, and 74d, respectively. Specifically, the cutting detection wire 73da extends from the control board 121, crosses over the cutting indication lines 74d, 74c, 74b, and 74a of the FPC 71, and crosses over again the cutting indication lines 74a, 74b, 74c, and 74d to reenter to the control board 121. The cutting detection wire 73db extends from the control board 121, crosses over the cutting indication lines 74d, 74c, and 74b of the FPC 71, and crosses over again the cutting indication lines 74b, 74c, and 74d to reenter to the control board 121. The cutting detection wire 73dc extends from the control board 121, crosses over the cutting indication lines 74d and 74c of the FPC 71, and crosses over again the cutting indication lines 74c and 74d to reenter to the control board 121. The cutting detection wire 73dd extends from the control board 121, crosses over the cutting indication line 74d of the FPC 71, and crosses over again the cutting indication line 74d to reenter to the control board 121.

In Modification 1, the cutting part determination circuit 200 determines, according to voltage levels of the cutting detection wires 73da, 73db, 73dc, and 73dd, at which of the cutting indication lines 74a, 74b, 74c, and 74d the FPC 71 has been cut.

The first resistor 211a is coupled in series to the second resistor 212a through the cutting detection wire 73da. An end on the first resistor 211a side of the series circuit constituted by the first resistor 211a, the second resistor 212a, and the cutting detection wire 73da is supplied with a power supply voltage Vdc from the power supply circuit 123, and an end on the second resistor 212a side of the series circuit is coupled to a ground potential GND. A detection potential VDout(A) at a coupling point between the cutting detection wire 73da and the second resistor 212a is output to the comparison unit 220.

The first resistor 211b is coupled in series to the second resistor 212b through the cutting detection wire 73db. An end on the first resistor 211b side of the series circuit constituted by the first resistor 211b, the second resistor 212b, and the cutting detection wire 73db is supplied with the power supply voltage Vdc from the power supply circuit 123, and an end on the second resistor 212b side of the series circuit is coupled to the ground potential GND. A detection potential VDout(B) at a coupling point between the cutting detection wire 73db and the second resistor 212b is output to the comparison unit 220.

The first resistor 211c is coupled in series to the second resistor 212c through the cutting detection wire 73dc. An end on the first resistor 211c side of the series circuit constituted by the first resistor 211c, the second resistor 212c, and the cutting detection wire 73dc is supplied with the power supply voltage Vdc from the power supply circuit 123, and an end on the second resistor 212c side of the series circuit is coupled to the ground potential GND. A detection potential VDout(C) at a coupling point between the cutting detection wire 73dc and the second resistor 212c is output to the comparison unit 220.

The first resistor 211d is coupled in series to the second resistor 212d through the cutting detection wire 73dd. An end on the first resistor 211d side of the series circuit constituted by the first resistor 211d, the second resistor 212d, and the cutting detection wire 73dd is supplied with the power supply voltage Vdc from the power supply circuit 123, and an end on the second resistor 212d side of the series circuit is coupled to the ground potential GND. A detection potential VDout(D) at a coupling point between the cutting detection wire 73dd and the second resistor 212d is output to the comparison unit 220.

The comparison unit 220 and the determination unit 230 are provided on the control board 121. In an aspect of the present invention, either one or both of the comparison unit 220 and the determination unit 230 may be included in the control circuit 122.

The comparison unit 220 includes voltage follower circuits 221a, 221b, 221c, 221d and comparator circuits 222a, 222b, 222c, and 222d.

The detection potential VDout(A) is received by the voltage follower circuit 221a. An output of the voltage follower circuit 221a is received by the comparator circuit 222a. The detection potential VDout(B) is received by the voltage follower circuit 221b. An output of the voltage follower circuit 221b is received by the comparator circuit 222b. The detection potential VDout(C) is received by the voltage follower circuit 221c. An output of the voltage follower circuit 221c is received by the comparator circuit 222c. The detection potential VDout(D) is received by the voltage follower circuit 221d. An output of the voltage follower circuit 221d is received by the comparator circuit 222d. The configuration of the comparison unit 220 illustrated in FIG. 16 is merely an example, and a configuration different from that illustrated in FIG. 16 can be employed. The present disclosure is not limited by the configuration of the comparison unit 220.

The comparison unit 220 compares the detection potentials VDout(A), VDout(B), VDout(C), and VDout(D) output from the cutting detector 210 with a comparison reference potential VCref, and outputs determination signals LGout(A), LGout(B), LGout(C), and LGout(D), respectively, to the determination unit 230. The determination unit 230 determines the cutting part of the FPC 71 based on the determination signals LGout(A), LGout(B), LGout(C), and LGout(D) output from the comparison unit 220, and outputs the determination result to the control circuit 122.

The following describes operation of the cutting part determination circuit 200 according to Modification 1. FIG. 18 is a chart illustrating relations between each of the determination signals and the cutting parts in the cutting part determination circuit according to Modification 1.

When the FPC 71 is cut at the cutting part A along the cutting indication line 74a and is coupled to the control board 121, only the cutting detection wire 73da is conductive, and the cutting detection wires 73db, 73dc, and 73dd are non-conductive. In this case, the detection potential VDout(A) is set to $Vdc \times r_2/(r_1+r_2)$, and the detection potentials VDout(B), VDout(C), and VDout(D) are set to the ground potential GND.

In Modification 1, the comparison reference potential VCref is set so that $Vdc \times r_2/(r_1+r_2) > VCref$. In this case, the determination signals LGout(A), LGout(B), LGout(C), and LGout(D) are set to "L", "H", "H", and "H", as illustrated in FIG. 18. The determination unit 230 outputs the determination result indicating that the FPC 71 is cut at the cutting part A to the control circuit 122.

When the FPC 71 is cut at the cutting part B along the cutting indication line 74b and is coupled to the control board 121, the cutting detection wires 73da and 73db are conductive, and the cutting detection wires 73dc and 73dd are non-conductive. In this case, the detection potentials VDout(A) and VDout(B) are set to $Vdc \times r_2/(r_1+r_2)$, and the detection potentials VDout(C) and VDout(D) are set to the ground potential GND.

In this case, the determination signals LGout(A), LGout(B), LGout(C), and LGout(D) are set to "L", "L", "H", and "H", as illustrated in FIG. 18. The determination unit 230 outputs the determination result indicating that the FPC 71 is cut at the cutting part B to the control circuit 122.

When the FPC 71 is cut at the cutting part C along the cutting indication line 74c and is coupled to the control board 121, the cutting detection wires 73da, 73db, and 73dc are conductive, and only the cutting detection wire 73dd is non-conductive. In this case, the detection potentials VDout(A), VDout(B), and VDout(C) are set to $Vdc \times r_2/(r_1+r_2)$, and the detection potential VDout(D) is set to the ground potential GND.

In this case, the determination signals LGout(A), LGout(B), LGout(C), and LGout(D) are set to "L", "L", "L", and "H", as illustrated in FIG. 18. The determination unit 230 outputs the determination result indicating that the FPC 71 is cut at the cutting part C to the control circuit 122.

When the FPC 71 is cut at the cutting part D along the cutting indication line 74d and is coupled to the control board 121, all the cutting detection wires 73da, 73db, 73dc, and 73dd are conductive. In this case, the detection potentials VDout(A), VDout(B), VDout(C), and VDout(D) are set to $Vdc \times r_2/(r_1+r_2)$.

In this case, the determination signals LGout(A), LGout(B), LGout(C), and LGout(D) are set to "L", "L", "L", and "L" as illustrated in FIG. 18. The determination unit 230 outputs the determination result indicating that the FPC 71 is cut at the cutting part D to the control circuit 122.

The configuration of Modification 1 described above allows the control circuit 122 to determine the cutting part of the FPC 71 and perform appropriate control.

Modification 2

Figure 19:
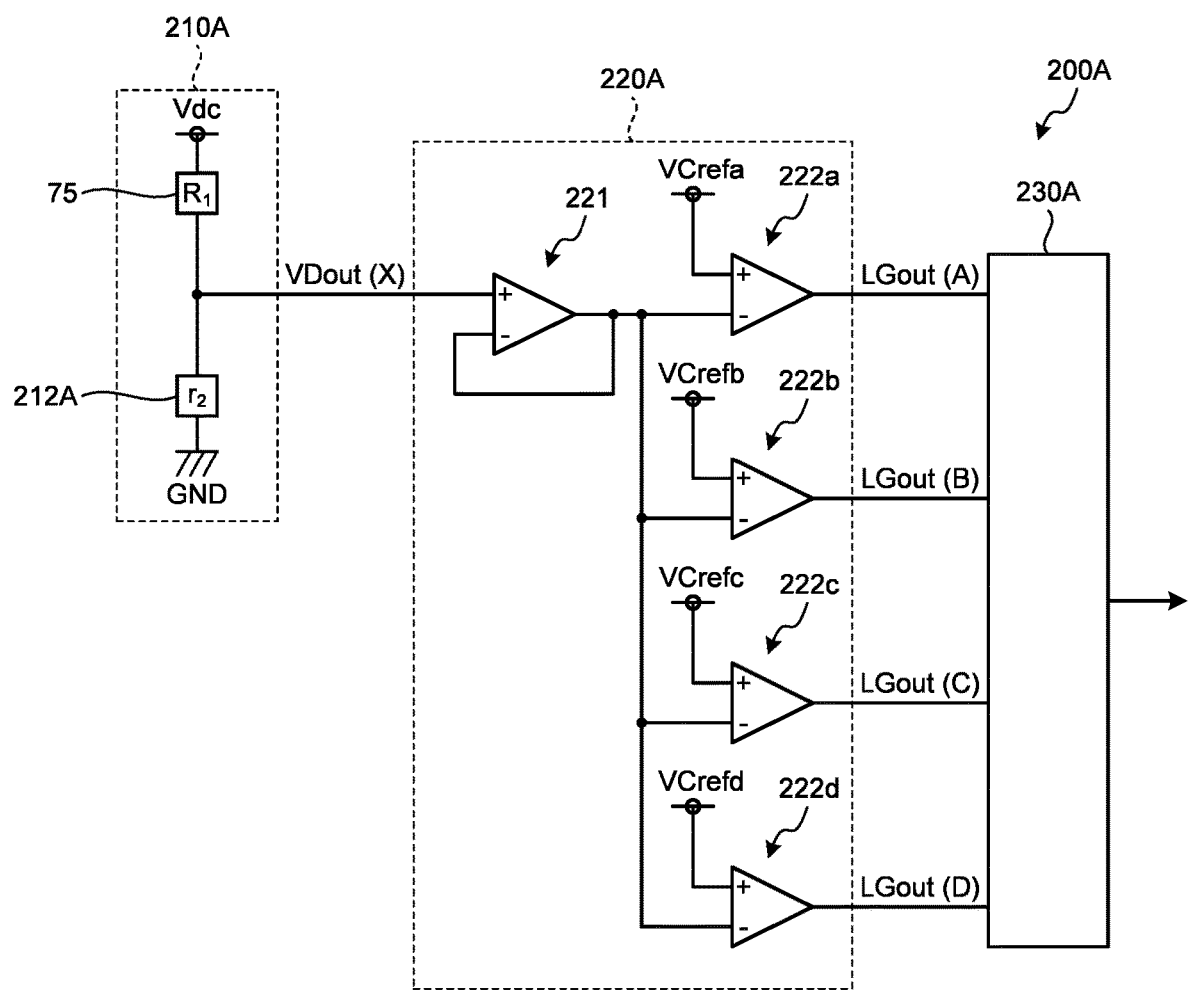
FIG. 19 is a diagram illustrating an exemplary block configuration of a cutting part determination circuit according to Modification 2.
Figure 20:
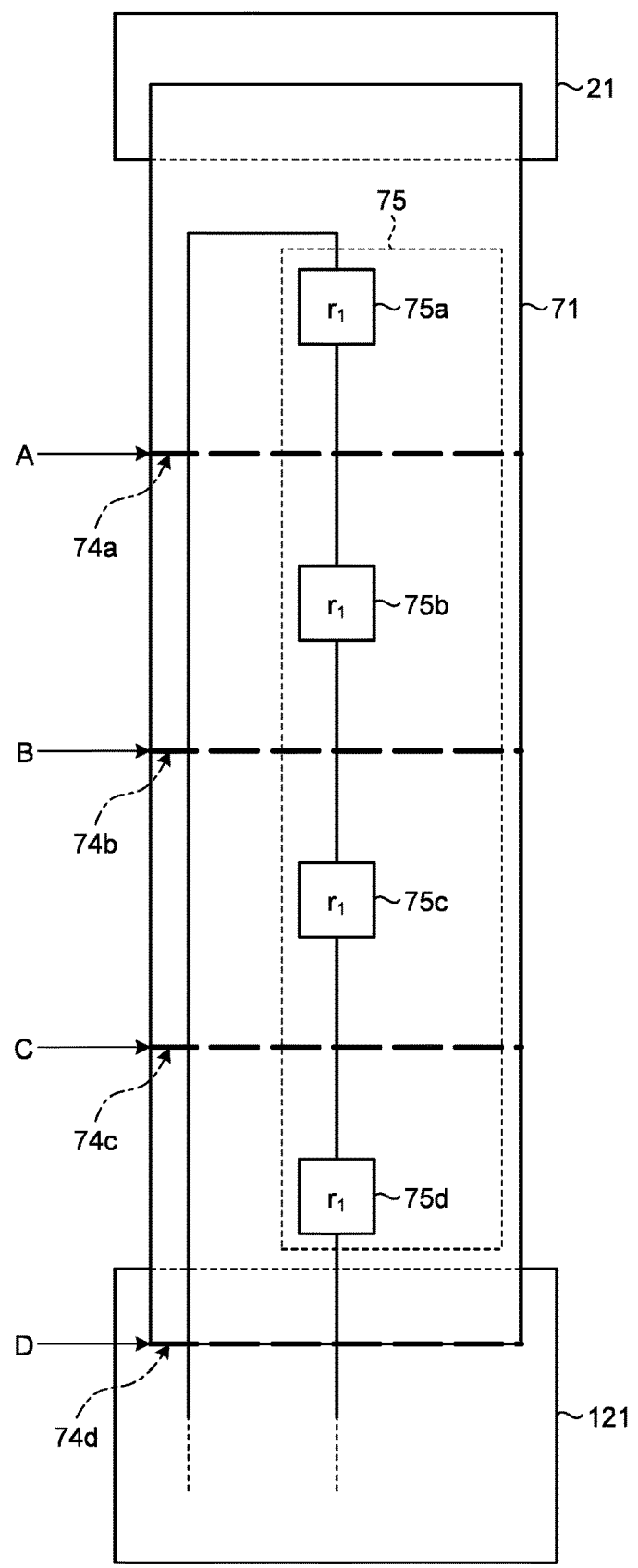
FIG. 20 is a diagram illustrating an example of a first resistor according to Modification 2.

FIG. 19 is a diagram illustrating an exemplary block configuration of a cutting part determination circuit according to Modification 2. FIG. 20 is a diagram illustrating an example of a first resistor according to Modification 2.

As illustrated in FIG. 19, a cutting part determination circuit 200A according to Modification 2 include a cutting detector 210A, a comparison unit 220A, and a determination unit 230A.

The cutting detector 210A includes a first resistor 75 and a second resistor 212A. In Modification 2, the first resistor 75 is a series resistor circuit constituted by resistors 75a, 75b, 75c, and 75d. As illustrated in FIG. 20, the resistors 75a, 75b, 75c, and 75d coupled in series correspondingly to the cutting indication lines 74a, 74b, 74c, and 74d, respectively, are provided as the first resistor 75 on the FPC 71. Specifically, the resistors 75a, 75b, 75c, and 75d are provided on wiring that extends from the control board 121, crosses over the cutting indication lines 74d, 74c, 74b, and 74a of the FPC 71, and crosses over again the cutting indication lines 74a, 74b, 74c, and 74d to reenter to the control board 121. The resistor 75a is provided on the sensor substrate 21 side of the cutting indication line 74a. The resistor 75b is provided between the cutting indication line 74a and the cutting indication line 74b. The resistor 75c is provided between the cutting indication line 74b and the cutting indication line 74c. The resistor 75d is provided between the cutting indication line 74c and the cutting indication line 74d.

In Modification 2, the cutting part determination circuit 200A determines, based on the output of the series resistor circuit constituted by the resistors 75a, 75b, 75c, and 75d, at which of the cutting indication lines 74a, 74b, 74c, and 74d the FPC 71 has been cut.

In Modification 2, the second resistor 212A is provided on the control board 121. In Modification 2, the resistance values of the resistors 75a, 75b, 75c, and 75d constituting the first resistor 75 are set to $r_1$, and the resistance value of the second resistor 212A is set to $r_2$.

The cutting detector 210A is formed by coupling the first resistor 75 to the second resistor 212A in series. An end on the first resistor 75 side of the series circuit constituted by the first resistor 75 and the second resistor 212A is supplied with the power supply voltage Vdc from the power supply circuit 123, and an end on the second resistor 212A side of the series circuit is coupled to the ground potential GND. The detection potential VDout(X) (X is A, B, C, or D) at a coupling point between the first resistor 75 and the second resistor 212A is output to the comparison unit 220A.

The comparison unit 220A and the determination unit 230A are provided on the control board 121. In an aspect of the present invention, either one or both of the comparison unit 220A and the determination unit 230A may be included in the control circuit 122.

The comparison unit 220A includes a voltage follower circuit 221 and the comparator circuits 222a, 222b, 222c, and 222d.

The detection potential VDout(X) is received by the voltage follower circuit 221. An output of the voltage follower circuit 221 is received by the comparator circuits 222a, 222b, 222c, and 222d. The configuration of the comparison unit 220A illustrated in FIG. 19 is merely an example, and a configuration different from that illustrated in FIG. 19 can be employed. The present disclosure is not limited by the configuration of the comparison unit 220A.

The comparison unit 220A compares the detection potential VDout(X) output from the cutting detector 210A with a first comparison reference potential VCrefa, a second comparison reference potential VCrefb, a third comparison reference potential VCrefc, and a first comparison reference potential VCrefd, and outputs the determination signals LGout(A), LGout(B), LGout(C), and LGout(D), respectively, to the determination unit 230A. The determination unit 230A determines the cutting part of the FPC 71 based on the determination signals LGout(A), LGout(B), LGout(C), and LGout(D) output from the comparison unit 220A, and outputs the determination result to the control circuit 122.

The following describes operation of the cutting part determination circuit 200A according to Modification 2. FIG. 21 is a chart illustrating the relations between each of the determination signals and the cutting parts in the cutting part determination circuit according to Modification 2.

When the FPC 71 is cut at the cutting part A along the cutting indication line 74a and is coupled to the control board 121, a resistance value $R_1$ of the first resistor 75 is set to the resistance value $r_1$ of the resistor 75a ($R_1=r_1$). In this case, the detection potential VDout(X) (=VDout (A)) is set to $Vdc \times r_2/(r_1+r_2)$.

When the FPC 71 is cut at the cutting part B along the cutting indication line 74b and is coupled to the control board 121, the resistance value $R_1$ of the first resistor 75 is set to a combined resistance value $2 \times r_1$ of the resistors 75a and 75b ($R_1=2 \times r_1$). In this case, the detection potential VDout(X) (=VDout(B)) is set to $Vdc \times r_2/(2 \times r_1+r_2)$.

When the FPC 71 is cut at the cutting part C along the cutting indication line 74c and is coupled to the control board 121, the resistance value $R_1$ of the first resistor 75 is set to a combined resistance value $3 \times r_1$ ($R_1=3 \times r_1$) of the resistors 75a, 75b, and 75c. In this case, the detection potential VDout(X) (=VDout(C)) is set to $Vdc \times r_2/(3 \times r_1+r_2)$.

When the FPC 71 is cut at the cutting part D along the cutting indication line 74d and is coupled to the control board 121, the resistance value $R_1$ of the first resistor 75 is set to a combined resistance value $4 \times r_1$ ($R_1=4 \times r_1$) of the resistors 75a, 75b, 75c, and 75d. In this case, the detection potential VDout(X) (=VDout(D)) is set to $Vdc \times r_2/(4 \times r_1+r_2)$.

In Modification 2, the magnitude relation among the first comparison reference potential VCrefa, the second comparison reference potential VCrefb, the third comparison reference potential VCrefc, the fourth comparison reference potential VCrefd, and the detection potentials VDout(A), VDout(B), VDout(C), and VDout(D) is set such that VCrefa>VDout(A)>VCrefb>VDout(B)>VCrefc>VDout(C)>VCrefd>VDout(D).

When the FPC 71 is cut at the cutting part A along the cutting indication line 74a and is coupled to the control board 121, the determination signals LGout(A), LGout(B), LGout(C), and LGout(D) are set to "H", "L", "L", and "L" as illustrated in FIG. 21. The determination unit 230A outputs the determination result indicating that the FPC 71 is cut at the cutting part A to the control circuit 122.

When the FPC 71 is cut at the cutting part B along the cutting indication line 74b and is coupled to the control board 121, the determination signals LGout(A), LGout(B), LGout(C), and LGout(D) are set to "H", "H", "L", and "L" as illustrated in FIG. 21. The determination unit 230A outputs the determination result indicating that the FPC 71 is cut at the cutting part B to the control circuit 122.

When the FPC 71 is cut at the cutting part C along the cutting indication line 74c and is coupled to the control board 121, the determination signals LGout(A), LGout(B), LGout(C), and LGout(D) are set to "H", "H", "H", and "L" as illustrated in FIG. 21. The determination unit 230A outputs the determination result indicating that the FPC 71 is cut at the cutting part C to the control circuit 122.

When the FPC 71 is cut at the cutting part D along the cutting indication line 74d and is coupled to the control board 121, the determination signals LGout(A), LGout(B), LGout(C), and LGout(D) are set to "H", "H", "H", and "H" as illustrated in FIG. 21. The determination unit 230A outputs the determination result indicating that the FPC 71 is cut at the cutting part D to the control circuit 122.

The configuration of Modification 2 described above allows the control circuit 122 to determine the cutting part of the FPC 71 and perform appropriate control.

Modification 3

Figure 22:
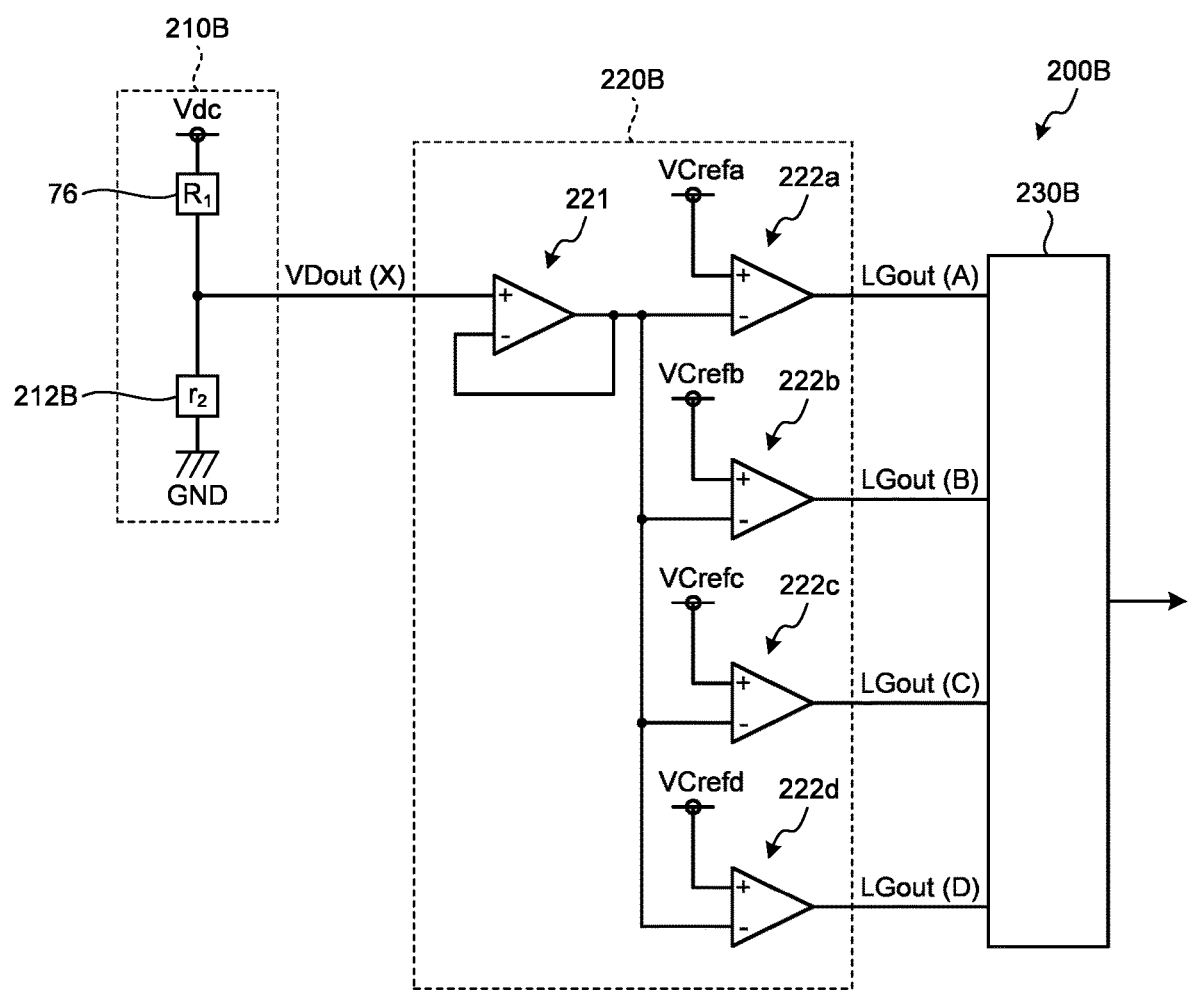
FIG. 22 is a diagram illustrating an exemplary block configuration of a cutting part determination circuit according to Modification 3.
Figure 23:
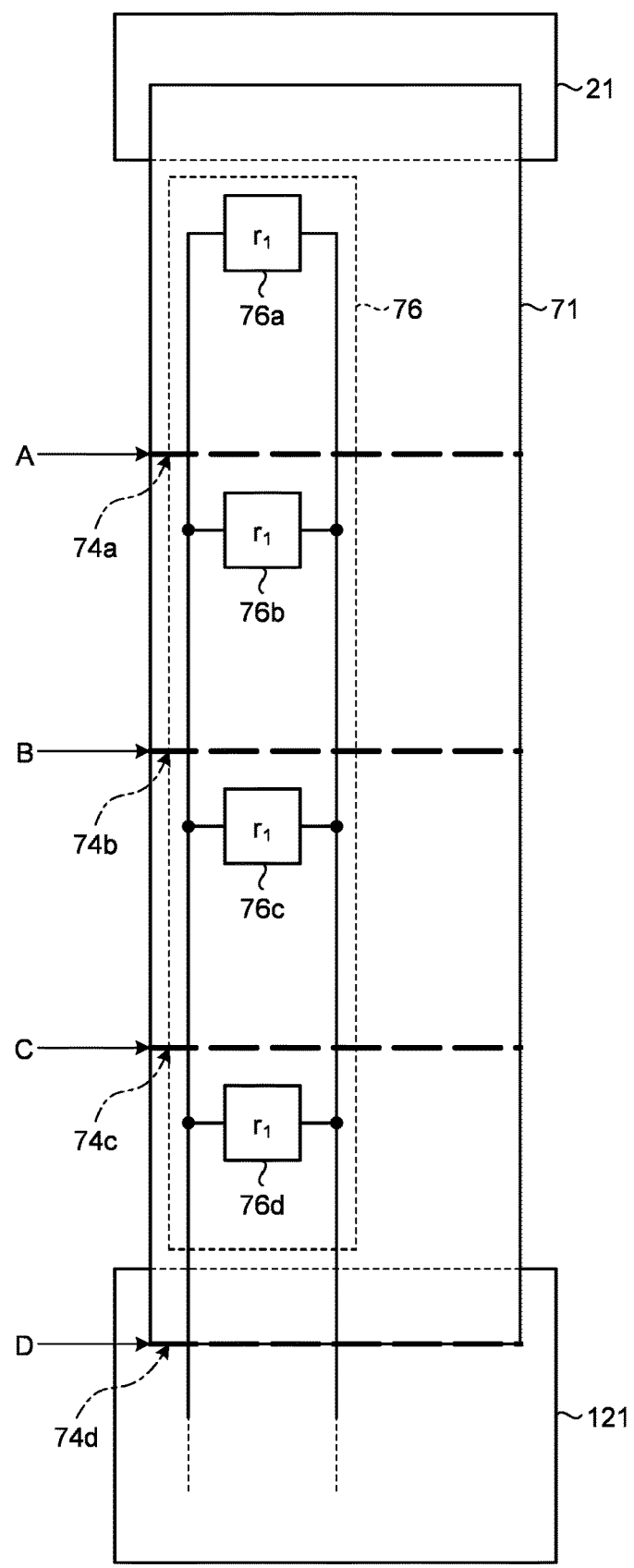
FIG. 23 is a diagram illustrating an example of a first resistor according to Modification 3.

FIG. 22 is a diagram illustrating an exemplary block configuration of a cutting part determination circuit according to Modification 3. FIG. 23 is a diagram illustrating an example of a first resistor according to Modification 3.

As Illustrated in FIG. 22, a cutting part determination circuit 200B according to Modification 3 includes a cutting detector 210B, a comparison unit 220B, and a determination unit 230B.

The cutting detector 210B includes a first resistor 76 and a second resistor 212B. In Modification 3, the first resistor 76 is a parallel resistor circuit constituted by resistors 76a, 76b, 76c, and 76d. As illustrated in FIG. 23, the resistors 76a, 76b, 76c, and 76d coupled in parallel correspondingly to the cutting indication lines 74a, 74b, 74c, and 74d, respectively, are provided as the first resistor 76 on the FPC 71. Specifically, the resistors 76a, 76b, 76c, and 76d are provided between two wires that extend from the control board 121 and crosses over the cutting indication lines 74d, 74c, 74b, and 74a of the FPC 71. The resistor 76a is provided on the sensor substrate 21 side of the cutting indication line 74a. The resistor 76b is provided between the cutting indication line 74a and the cutting indication line 74b. The resistor 76c is provided between the cutting indication line 74b and the cutting indication line 74c. The resistor 76d is provided between the cutting indication line 74c and the cutting indication line 74d.

In Modification 3, the cutting part determination circuit 200B determines, based on the output of the parallel resistor circuit constituted by the resistors 76a, 76b, 76c, and 76d, at which of the cutting indication lines 74a, 74b, 74c, and 74d the FPC 71 has been cut.

In Modification 3, the second resistor 212B is provided on the control board 121. In Modification 3, the resistance values of the resistors 76a, 76b, 76c, and 76d constituting the first resistor 76 are set to $r_1$, and the resistance value of the second resistor 212B is set to $r_2$.

The cutting detector 210B is formed by coupling the first resistor 76 to the second resistor 212B in series. An end on the first resistor 76 side of the series circuit constituted by the first resistor 76 and the second resistor 212B is supplied with the power supply voltage Vdc from the power supply circuit 123, and an end on the second resistor 212B side of the series circuit is coupled to the ground potential GND. The detection potential VDout(X) (X is A, B, C, or D) at a coupling point between the first resistor 76 and the second resistor 212b is output to the comparison unit 220B.

The comparison unit 220B and the determination unit 230B are provided on the control board 121. In an aspect of the present invention, either one or both of the comparison unit 220B and the determination unit 230B may be included in the control circuit 122.

The comparison unit 220B includes the voltage follower circuit 221 and the comparator circuits 222a, 222b, 222c, and 222d.

The detection potential VDout(X) is received by the voltage follower circuit 221. The output of the voltage follower circuit 221 is received by the comparator circuits 222a, 222b, 222c, and 222d. The configuration of the comparison unit 220B illustrated in FIG. 22 is merely an example, and a configuration different from that illustrated in FIG. 22 can be employed. The present disclosure is not limited by the configuration of the comparison unit 220B.

The comparison unit 220B compares the detection potential VDout(X) output from the cutting detector 210B with the first comparison reference potential VCrefa, the second comparison reference potential VCrefb, the third comparison reference potential VCrefc, and the first comparison reference potential VCrefd, and outputs the determination signals LGout(A), LGout(B), LGout(C), and LGout(D), respectively, to the determination unit 230B. The determination unit 230B determines the cutting part of the FPC 71 based on the determination signals LGout(A), LGout(B), LGout(C), and LGout(D) output from the comparison unit 220B, and outputs the determination result to the control circuit 122.

The following describes operation of the cutting part determination circuit 200B according to Modification 3. FIG. 24 is a chart illustrating the relations between each of the determination signals and the cutting parts in the cutting part determination circuit according to Modification 3.

When the FPC 71 is cut at the cutting part A along the cutting indication line 74a and is coupled to the control board 121, the resistance value $R_1$ of the first resistor 76 is set to the resistance value $r_1$ of the resistor 76a ($R_1=r_1$). In this case, the detection potential VDout(X) (=VDout (A)) is set to $Vdc \times r_2/(r_1+r_2)$.

When the FPC 71 is cut at the cutting part B along the cutting indication line 74b and is coupled to the control board 121, the resistance value $R_1$ of the first resistor 76 is set to a combined resistance value $r_1/2$ of the resistors 76a and 76b ($R_1=r_1/2$). In this case, the detection potential VDout(X) (=VDout(B)) is set to $Vdc \times r_2/(r_1/2+r_2)$.

When the FPC 71 is cut at the cutting part C along the cutting indication line 74c and is coupled to the control board 121, the resistance value $R_1$ of the first resistor 76 is set to a combined resistance value $r_1/3$ ($R_1=r_1/3$) of the resistors 76a, 76b, and 76c. In this case, the detection potential VDout(X) (=VDout(B)) is set to $Vdc \times r_2/(r_1/3+r_2)$.

When the FPC 71 is cut at the cutting part D along the cutting indication line 74d and is coupled to the control board 121, the resistance value $R_1$ of the first resistor 76 is set to a combined resistance value $r_1/4$ ($R_1=r_1/4$) of the resistors 76a, 76b, 76c, and 76d. In this case, the detection potential VDout(X) (=VDout(B)) is set to $Vdc \times r_2/(r_1/4+r_2)$.

In Modification 3, the magnitude relation among the first comparison reference potential VCrefa, the second comparison reference potential VCrefb, the third comparison reference potential VCrefc, the fourth comparison reference potential VCrefd, and the detection potentials VDout(A), VDout(B), VDout(C), and VDout(D) is set such that VCrefa>VDout(D)>VCrefb>VDout(C)>VCrefc>VDout(B)>VCrefd>VDout(A).

When the FPC 71 is cut at the cutting part A along the cutting indication line 74a and is coupled to the control board 121, the determination signals LGout(A), LGout(B), LGout(C), and LGout(D) are set to "H", "H", "H", and "H" as illustrated in FIG. 24. The determination unit 230B outputs the determination result indicating that the FPC 71 is cut at the cutting part A to the control circuit 122.

When the FPC 71 is cut at the cutting part B along the cutting indication line 74b and is coupled to the control board 121, the determination signals LGout(A), LGout(B), LGout(C), and LGout(D) are set to "H", "H", "H", and "L" as illustrated in FIG. 24. The determination unit 230B outputs the determination result indicating that the FPC 71 is cut at the cutting part B to the control circuit 122.

When the FPC 71 is cut at the cutting part C along the cutting indication line 74c and is coupled to the control board 121, the determination signals LGout(A), LGout(B), LGout(C), and LGout(D) are set to "H", "H", "L", and "L" as illustrated in FIG. 24. The determination unit 230B outputs the determination result indicating that the FPC 71 is cut at the cutting part C to the control circuit 122.

When the FPC 71 is cut at the cutting part D along the cutting indication line 74d and is coupled to the control board 121, the determination signals LGout(A), LGout(B), LGout(C), and LGout(D) are set to "H", "L", "L", and "L" as illustrated in FIG. 24. The determination unit 230B outputs the determination result indicating that the FPC 71 is cut at the cutting part D to the control circuit 122.

The configuration of Modification 3 described above allows the control circuit 122 to determine the cutting part of the FPC 71 and perform appropriate control.

The present disclosure is not limited by the purpose of use of the determination results in each of the modifications described above. For example, in each of the above-described modifications in an aspect of the present invention, if the determination result at the time of start of the detection device 1 indicates that the FPC is not coupled to the control board 121, specifically, for example, in Modification 1, if the determination signals LGout(A), LGout(B), LGout(C), and LGout(D) are set to "H", "H", "H", and "H", a message may be displayed prompting to reattach the sensor substrate 21 to the external higher-level control device (not illustrated).

While the preferred embodiment of the present invention has been described above, the present invention is not limited to the embodiment described above. The content disclosed in the embodiment is merely exemplary, and can be variously changed within the scope not departing from the gist of the present invention. Any modifications appropriately made within the scope not departing from the gist of the present invention also naturally belong to the technical scope of the present invention. At least one of various omissions, substitutions, and changes of components can be made without departing from the gist of the embodiment and the modifications described above.

What is claimed is:

1. A detection device comprising:
a sensor substrate provided with a plurality of photosensors;
a control board provided with a control circuit configured to control the photosensors; and
a flexible printed circuit board provided with wiring configured to electrically couple the sensor substrate to the control board, wherein
the flexible printed circuit board is provided with a plurality of cutting indication lines for changing a length between the sensor substrate and the control board.

2. The detection device according to claim 1, wherein
the control board is provided with a connector configured to couple the flexible printed circuit board to the control board, and
the flexible printed circuit board comprises a terminal provided with a plurality of pads configured to electrically couple the wiring to contact points of the connector.

3. The detection device according to claim 2, wherein
the pads are provided along the cutting indication lines, and
the terminal is provided for each of the cutting indication lines.

4. The detection device according to claim 3, wherein
the flexible printed circuit board is provided with a plurality of cutting detection wires provided correspondingly to the cutting indication lines, and
the control board comprises a cutting part determination circuit configured to determine, according to whether each of the cutting detection wires is present, at which of the cutting indication lines the flexible printed circuit board has been cut.

5. The detection device according to claim 3, wherein
the flexible printed circuit board is provided with a series resistor circuit in which a plurality of resistors provided correspondingly to the cutting indication lines are coupled in series, and
the control board comprises a cutting part determination circuit configured to determine, based on an output of the series resistor circuit, at which of the cutting indication lines the flexible printed circuit board has been cut.

6. The detection device according to claim 3, wherein
the flexible printed circuit board is provided with a parallel resistor circuit in which a plurality of resistors provided correspondingly to the cutting indication lines are coupled in parallel, and
the control board comprises a cutting part determination circuit configured to determine, based on an output of the parallel resistor circuit, at which of the cutting indication lines the flexible printed circuit board has been cut.

7. The detection device according to claim 1, wherein the wiring comprises power supply wiring configured to supply power to the sensor substrate, and comprises ground wiring.

8. The detection device according to claim 7, wherein each of the cutting indication lines comprises a dot row constituted by a plurality of dots that pass through the flexible printed circuit board.

9. The detection device according to claim 8, wherein a distance between the dots adjacent to each other is larger than a width of at least one piece of the power supply wiring and at least one piece of the ground wiring, and at least one of the dots is provided between the power supply wiring and the ground wiring adjacent to each other.

10. The detection device according to claim 7, wherein the power supply wiring provided on one surface of the flexible printed circuit board and the ground wiring provided on another surface of the flexible printed circuit board are arranged so as to be shifted from each other in a plan view.

* * * * *